(12) United States Patent
Yu et al.

(10) Patent No.: US 12,247,112 B2
(45) Date of Patent: Mar. 11, 2025

(54) PEROVSKITE-POLYMER COMPOSITE MATERIALS, DEVICES, AND METHODS

(71) Applicant: The Florida State University Research Foundation, Inc., Tallahassee, FL (US)

(72) Inventors: Zhibin Yu, Tallahassee, FL (US); Haoran Li, Tallahassee, FL (US); Xin Shan, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 1129 days.

(21) Appl. No.: 16/978,231

(22) PCT Filed: Apr. 4, 2019

(86) PCT No.: PCT/US2019/025731
§ 371 (c)(1),
(2) Date: Sep. 4, 2020

(87) PCT Pub. No.: WO2019/195517
PCT Pub. Date: Oct. 10, 2019

(65) Prior Publication Data
US 2021/0002505 A1 Jan. 7, 2021

Related U.S. Application Data

(60) Provisional application No. 62/653,038, filed on Apr. 5, 2018.

(51) Int. Cl.
| | |
|---|---|
| *C08K 3/16* | (2006.01) |
| *H10K 30/60* | (2023.01) |
| *H10K 39/36* | (2023.01) |
| *H10K 71/13* | (2023.01) |

(Continued)

(52) U.S. Cl.
CPC ............... *C08K 3/16* (2013.01); *H10K 30/60* (2023.02); *H10K 39/36* (2023.02); *H10K 71/13* (2023.02);
(Continued)

(58) Field of Classification Search
CPC .......... C08K 3/16; H10K 30/60; H10K 39/36; H10K 71/13; H10K 85/50; H10K 2102/351; G01T 1/24
See application file for complete search history.

(56) References Cited

U.S. PATENT DOCUMENTS

| | | | |
|---|---|---|---|
| 2017/0084848 A1 | 3/2017 | Gao et al. | |
| 2018/0010039 A1 | 1/2018 | Dong et al. | |

FOREIGN PATENT DOCUMENTS

| | | |
|---|---|---|
| WO | 2016/200897 A1 | 12/2016 |
| WO | 2017/037448 A1 | 3/2017 |
| WO | 2019/053567 A1 | 3/2019 |

OTHER PUBLICATIONS

PCT International Search Report and Written Opinion for PCT Application No. PCT/US2019/025731 mailed Sep. 13, 2019 (18 pages).

(Continued)

*Primary Examiner* — Gerard Higgins
(74) *Attorney, Agent, or Firm* — Eversheds Sutherland (US) LLP

(57) ABSTRACT

Composite materials that include a polymer matrix and a metal halide perovskite. The metal halide perovskite may be a lead-free metal halide double perovskite. Devices that include a layer of a composite material, a first electrode, and a second electrode. Methods of forming composite materials and devices, including methods that include printing one or more layers with a 3D printer.

8 Claims, 21 Drawing Sheets

(51) Int. Cl.
  *G01T 1/24* (2006.01)
  *H10K 85/50* (2023.01)
  *H10K 102/00* (2023.01)
(52) U.S. Cl.
  CPC ............... *G01T 1/24* (2013.01); *H10K 85/50* (2023.02); *H10K 2102/351* (2023.02)

(56) References Cited

OTHER PUBLICATIONS

Barisco et al., "Direct X-Ray Photoconversion in Flexible Organic Thin Film Devices Operated Below 1V," Nature Communications, 2016 (10 pages).
Sun et al., "Highly Luminescent, Stable, Transparent and Flexible Perovskite Quantum Dot Gels Towards Light-Emitting Diodes," Nanotechnology, 2017, 289:365501 (9 pages).
Swarnkar et al., "Beyond Dolloidal Cesium Lead Halide Perovskite Nanocrystals: Analogous Metal Halides and Doping," ACS Energy Lett, 2017, 2:1089-1098.
Wang et al., "Solution-Processed Photodetectors Based on Organic-Inorganic Hybrid Perovskite and Nanocrystalline Graphite," Nanotechnology, 2016, 27:175201 (7 pages).
Wang et al., "Ultrastable, Highly Luminescent Organic-Inorganic Perovskite-Polymer Composite Films," Adv. Mater., 2016, 28:10710-10717.
Yakunin et al., "Detection of X-Ray Photons by Solution-Processed Lead Halide Perovskites," Nature Photonics, 2015, 9:444-450.
Zhou et al., "In Situ Fabrication of Halide Perovskite Nanocrystal-Embedded Polymer Composite Films with Enhanced Photoluminescence for Display Backlights," Adv. Mater., 2016, 28:9163-9168.

PEROVSKITE-POLYMER COMPOSITE MATERIALS, DEVICES, AND METHODS

CROSS-REFERENCE TO RELATED APPLICATIONS

This application claims priority to U.S. Provisional Patent Application No. 62/653,038, filed Apr. 5, 2018, which is incorporated herein by reference.

STATEMENT REGARDING FEDERALLY SPONSORED RESEARCH AND DEVELOPMENT

This invention was made with government support under FA9550-16-1-0124 awarded by the Air Force Office of Scientific Research. The government has certain rights in the invention.

BACKGROUND

Digital X-ray imaging has a number of important applications, including, but not limited to, medical diagnostics, security screening, national defense, and industrial product inspection.

Two imaging mechanisms are commonly adopted, and these mechanisms typically include absorbing incoming X-ray photons and converting the photons either to mobile charge carriers using photoconductors, or to lower energy photons with scintillation phosphors.

Photoconductors normally exceed phosphors in spatial resolution, which can be beneficial for the identification of small objects and/or fine features. Amorphous selenium, polycrystalline cadmium telluride, and crystalline silicon based materials have been investigated as X-ray photoconductors. The high vacuum and/or high temperature processes needed for these materials, however, have limited their potential use in many applications, including low-cost and/or large area applications.

Halide perovskite semiconductors have attracted attention due, at least in part, to their charge transport properties and/or solubility in certain organic solvents (see, e.g., Gratzel, M. *Nat. Mater.* 2014, 13(9), 838-842; Stranks, S. D. et al. *Nat. Nanotechnol.* 2015, 10(5), 391-402; and Wehrenfennig, C. et al. *Adv. Mater.* 2014, 26(10), 1584-1589). Solution-processed solar cells and light-emitting diodes (LEDs) with very high efficiencies have been demonstrated (see, e.g., Liu, M. Z. et al. *Nature* 2013, 501 (7467) 395). Many halide perovskite compounds include elements with relatively large atomic numbers, which can be important for achieving a high stopping power for high energy photons (see, e.g., Yakunin, S. et al. *Nature Photonics* 2015, 9 (7), 444). For instance, solution-processed methylammonium lead triiodide ($MAPbI_3$) films for X-ray detection have been developed, along with wafer-scale $MAPbI_3$ films made with a room-temperature sintering process. X-ray sensitivities of 2.5 to 25 $\mu C$ $mGy_{air}^{-1}$ $cm^{-2}$ in these perovskite-based detectors have been demonstrated.

Methylammonium lead tribromide ($MAPbBr_3$) single crystals and $MAPbBr_3$-silicon integrated crystals having sensitivities of 80 $\mu C$ $mGy_{air}^{-1}$ $cm^{-2}$ and $2.1 \times 10^4$ $\mu C$ $mGy_{air}^{-1}$ $cm^2$, respectively, have been reported (Wei, H. T. et al. *Nature Photonics* 2016, 10 (5), 333; and Wei, W. et al. *Nature Photonics* 2017, 11 (5), 315). Such high sensitivities have exceeded those of commercial X-ray detectors based on amorphous selenium. Halide double perovskite ($Cs_2AgBiBr_6$) single crystals having been reported, which have an X-ray sensitivity of 0.01-0.1 $\mu C$ $mGy_{air}^{-1}$ $cm^2$ (see, e.g., Pan, W. C. et al. *Nature Photonics* 2017, 11 (11), 726). However, most, if not all, of these materials lack suitable mechanical flexibility.

$MAPbI_3$, formamidinium lead triiodide ($FAPbI_3$), I-treated $MAPbBr_3$ single crystals, and $CH_3NH_3PbBr_{3-x}Cl_x$ perovskite single crystals have been reported for gamma-ray detection (see, e.g., Yakunin, S. et al. *Nature Photonics* 2016, 10 (9), 585-589; and Wei, H. T. et al. *Nat. Mater.* 2017, 16 (8), 826). The fabrication of single crystals, however, is usually time consuming, and the machining of single crystals into a desired shape and/or thickness is usually difficult. In addition, the hygroscopic nature of these single crystals can cause a short service lifetime in ambient environments, and/or cause reliability issues, especially when used for gamma-ray detection.

Flexible X-ray or gamma-ray detectors are desirable, at least in part, for their lightweight and/or ability to adhere conformally to uneven surfaces, which may enable portable diagnostic tools and/or potentially reduce image distortion in cone beam computed tomography. Flexible solar cells and LEDs have been achieved using thin layers (tens of nanometers to a few micrometers) of halide perovskites as the light absorbers or emitters (see, e.g., Li, Y. et al. *Nature Communications* 2016, 7, 10214). However, halide perovskite layers having thicknesses of tens-of-micrometers typically are required to effectively absorb X-rays, and films having such thicknesses usually crack and/or delaminate from substrates under strain.

There remains a need for materials that include metal halide perovskites, and address one or more of the foregoing disadvantages. For example, there remains a need for relatively thick metal halide perovskite films that do not crack and/or delaminate. As a further example, there also remains a need for relatively thick metal halide perovskite materials that are more environmentally benign and/or can be easily fabricated or machined into different shapes and/or thicknesses.

BRIEF SUMMARY

Provided herein are composite materials that overcome one or more of the foregoing disadvantages. For example, composite materials that include a metal halide perovskite dispersed in a polymer matrix are provided, and the composite materials may be flexible. In some embodiments, the composite materials include a metal halide perovskite and a polymer matrix, and the bending of the composite materials does not result in any substantial performance degradation. In some embodiments, the composite materials provided herein may be prepared via solution processing. The composite materials provided herein also may be amenable to 3D printing.

In one aspect, composite materials are provided. In some embodiments, the composite materials include a polymer matrix comprising a polymer; and a metal halide perovskite dispersed in the polymer matrix.

In some embodiments, the metal halide perovskite is a lead-free metal halide double perovskite. In some embodiments, the metal halide perovskite is a lead-free metal halide double perovskite of the following formula:

$$Cs_2BB'X_6 \qquad \text{(formula (I))},$$

wherein B is Sb or Bi, B' is Cu, Ag, or Au, and X is Cl, Br, or I.

In some embodiments, the metal halide perovskite is of the following formula:

$$ABX_3 \qquad \text{(formula (II))},$$

wherein A is a +1 cation, B is a +2 cation, and X is Cl, Br, or I.

In some embodiments, the metal halide perovskite is of the following formula:

$$A_2BX_4 \qquad \text{(formula (III))},$$

wherein A is a +1 cation, B is a +2 cation, and X is Cl, Br, or I.

In some embodiments, the metal halide perovskite is of the following formula:

$$A_2A'_nB_{n+1}X_{3n+4} \qquad \text{(IV)},$$

wherein n is 1 to ∞, (n+1) equals a number of $BX_6$ octahedral layers in the metal halide perovskite, A is an organic +1 cation comprising at least 4 carbon atoms, A' is an organic +1 cation comprising 1 to 3 carbon atoms, B is a +2 cation, and X is Cl, Br, or I.

In another aspect, devices are provided. In some embodiments, the devices include a first electrode; a second electrode; and a film of a composite material described herein, wherein the film is arranged between the first electrode and the second electrode.

In some embodiments, the devices include a first electrode; a second electrode; and a film of a composite material described herein, wherein the film has a first side and a second side, and the first electrode and the second electrode are arranged on the first side of the film.

In yet another aspect, methods of forming composite materials are provided. In some embodiments, the methods include providing a mixture comprising CsX, BX, B'X, a polymer, and a liquid; and evaporating the liquid to form the composite material; wherein B is Sb or Bi, B' is Cu, Ag, or Au, and X is Cl, Br, or I.

In a still further aspect, methods of forming devices are provided. In some embodiments, the methods include printing with a 3D printer a film of a composite material described herein on a substrate, wherein the film has a first side and a second side, and the first side is in contact with the substrate after the printing. The substrate may be a glass substrate, or the substrate may be an electrode.

Additional aspects will be set forth in part in the description which follows, and in part will be obvious from the description, or may be learned by practice of the aspects described herein. The advantages described herein will be realized and attained by means of the elements and combinations particularly pointed out in the appended claims. It is to be understood that both the foregoing general description and the following detailed description are exemplary and explanatory only and are not restrictive.

DETAILED DESCRIPTION

Figure 1A:
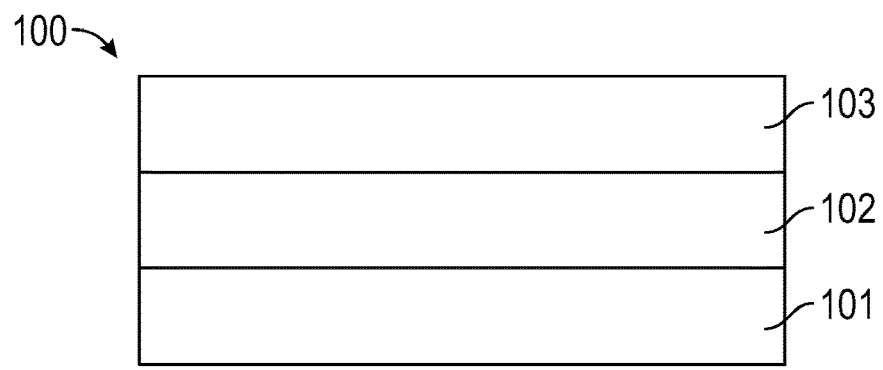
FIG. 1A depicts an embodiment of a device described herein.

Provided herein are composite materials, devices that include composite materials, and methods of forming composite materials and devices.

Composite Materials

The composite materials herein generally include a metal halide perovskite and a polymer matrix. The metal halide perovskites of the composite materials described herein are dispersed in the polymer matrices. In some embodiments, a metal halide perovskite is evenly dispersed in a polymer matrix. In some embodiments, a metal halide perovskite is substantially evenly dispersed in a polymer matrix. In some embodiments, a metal halide perovskite is unevenly dispersed in a polymer matrix; e.g., randomly dispersed, dispersed in cloisters or in a gradient. a A metal halide perovskite is "substantially evenly dispersed" in a polymer matrix when the metal halide perovskite:polymer matrix ratios of any two randomly-selected, non-overlapping areas of a composite material are within 10%, or about 5%, of each other. For example, if one area of a composite material has a metal halide perovskite:polymer matrix ratio of 2:1, then the metal halide perovskite is "substantially evenly dispersed" in the composite material if a ratio of a second area of the composite material is about 1.8-2.2:1 (±10%), or 1.9-2.1:1 (±5%). If the ratio of the second area is outside of these ranges, then the metal halide perovskite is "unevenly dispersed" in the polymer matrix.

The composite materials generally may include any ratio of metal halide perovskite to polymer matrix. In some embodiments, the weight ratio of the metal halide perovskite to the polymer matrix is about 1:10 to about 10:1. In some embodiments, the weight ratio of the metal halide perovskite to the polymer matrix is about 1:8 to about 8:1. In some embodiments, the weight ratio of the metal halide perovskite to the polymer matrix is about 1:6 to about 6:1. In some embodiments, the weight ratio of the metal halide perovskite to the polymer matrix is about 1:3 to about 6:1. In some embodiments, the weight ratio of the metal halide perovskite to the polymer matrix is about 1:2 to about 6:1. In some embodiments, the weight ratio of the metal halide perovskite to the polymer matrix is about 1:1 to about 6:1. In some embodiments, the weight ratio of the metal halide perovskite to the polymer matrix is about 1:1 to about 4:1. In some embodiments, the weight ratio of the metal halide perovskite to the polymer matrix is about 1:1 to about 3:1. In some embodiments, the weight ratio of the metal halide perovskite to the polymer matrix is about 1.5:1 to about 2.5:1. In some embodiments, the weight ratio of the metal halide perovskite to the polymer matrix is about 2:1.

The composite materials described herein generally may have any dimensions, and be in any form. For example, the composite materials may be in the form of one or more particles (e.g., a powder), one or more filaments, a rod, a film (e.g., a ribbon, sheet, etc.), other three-dimensional objects, etc. The composite materials may be arranged in any manner in the devices described herein; for example, a composite material may be present in the devices described herein as a powder, a filament, a rod, a film, or an array of discrete filaments, rods, films, etc.

In some embodiments, the composite materials are films. Films of the composite materials may have any shape and/or dimensions (length, width, and thickness), and the shape and/or dimensions may be tailored for particular applications. The length and/or width of the films may be limited only by the desirable size of a device and/or the production method (e.g., 3D printing). For some applications, depending at least on the energy of incident photons, a composite material of an appropriate thickness may be selected. As an example, for gamma-ray detection, films of the composite materials may have a thickness of about 3 mm to about 10 cm, but films having significantly smaller thicknesses may be appropriate for other applications, such as those described in the Examples. As a further example, films of the composite materials may have a surface that is square, rectangular, circular, polygonal, non-polygonal, etc.

In some embodiments, the composite material is a film having a thickness of about 2 μm to about 10 cm. In some embodiments, the composite material is a film having a thickness of about 2 μm to about 8 cm. In some embodiments, the composite material is a film having a thickness of about 2 μm to about 6 cm. In some embodiments, the composite material is a film having a thickness of about 2 μm to about 4 cm. In some embodiments, the composite material is a film having a thickness of about 2 μm to about 2 cm. In some embodiments, the composite material is a film having a thickness of about 2 μm to about 1 cm. In some embodiments, the composite material is a film having a thickness of about 40 μm to about 800 μm. In some embodiments, the composite material is a film having a thickness of about 40 μm to about 600 μm. In some embodiments, the composite material is a film having a thickness of about 40 μm to about 500 μm. In some embodiments, the composite material is a film having a thickness of about 40 μm to about 400 μm. In some embodiments, the composite material is a film having a thickness of about 40 μm to about 300 μm. In some embodiments, the composite material is a film having a thickness of about 50 μm to about 200 μm. In some embodiments, the composite material is a film having a thickness of about 50 μm to about 150 μm. In some embodiments, the composite material is a film having a thickness of about 75 μm to about 125 μm.

Metal Halide Perovskites

Generally, any metal halide perovskite may be included the composite materials described herein. In some embodiments, the composite materials include one type of metal halide perovskite. In some embodiments, the composite materials include two or more different types of metal halide perovskite. The phrase "two or more different types of metal halide perovskites" may refer to two metal halide perovskites that [1] include different atoms (for example, Sb instead of Bi), and/or [2] have different structures (e.g., cubic perovskites, double perovskites, layered perovskites (e.g., Ruddleson-Popper, Aurivillius, Dion-Jacobson, etc.), etc.).

As used herein, the phrase "metal halide perovskite" generally refers to metal halide perovskites having a crystalline structure, wherein the repeating unit of the crystalline structure is a unit cell, which may be used to derive a formula of a "metal halide perovskite", such as those described herein and represented by formula (I), formula (II), formula (III), and formula (IV). The crystalline structure may be formed by an array of the unit cells, the array extending in one, two, or three dimensions. A "metal halide perovskite" may include one crystal or a plurality of crystals, which, as described herein, may be dispersed in another material, such as a polymeric matrix.

In some embodiments, the metal halide perovskite of the composite materials provided herein is a lead-free metal halide double perovskite.

In some embodiments, the lead-free metal halide double perovskite is a lead-free metal halide double perovskite according to formula (I):

$$Cs_2BB'X_6 \qquad (I),$$

wherein B and B' are two different cations having a total charge of +4. For example, B may be a +3 cation and B' may be a +1 cation. As a further example, B may be a +2 cation and B' may be a +2 cation.

In some embodiments, the lead-free metal halide double perovskite is a lead-free metal halide double perovskite according to formula (I), wherein B is Sb or Bi; B' is Cu, Ag, or Au; and X is Cl, Br, or I.

In some embodiments, the metal halide perovskite is a lead-free metal halide double perovskite according to formula (I), wherein B is Bi; B' is Ag; and X is Br, and the metal halide perovskite has the formula (Ia):

$$Cs_2BiAgBr_6 \qquad (Ia).$$

Not wishing to be bound by any particular theory, it is believed that $Cs_2BiAgBr_6$ (which, like the other metal halide perovskites described herein, may also be written as "$Cs_2AgBiBr_6$") has a relatively low toxicity. Regarding the structure of $Cs_2BiAgBr_6$, it is believed that the structure of $Cs_2BiAgBr_6$ includes unit cells that are similar to those of haloplumbate perovskites, because one $Ag^+$ and one $Bi^{3+}$ of $Cs_2BiAgBr_6$ replace two of the $Pb^{2+}$ sites in the haloplumbate perovskites, while maintaining the corner-sharing metal-halide octahedral network of perovskite crystals (see, e.g., Filip, M. R. et al. *Journal of Physical Chemistry Letters* 2016, 7 (13), 2579-2585; Zhang, P. et al. *Journal of Materials Chemistry A* 2018, 6 (4), 1809-1815; and Filip, M. R. et al. *Journal of Physical Chemistry C* 2018, 122 (1), 158-170).

In some embodiments, the metal halide perovskite is a lead-free metal halide double perovskite according to formula (I), wherein B is Bi; B' is Au; and X is Br, and the metal halide perovskite has the formula (Ib):

$$Cs_2BiAuBr_6 \qquad (Ib).$$

In some embodiments, the metal halide perovskite is a lead-free metal halide double perovskite according to formula (I), wherein B is Sb; B' is Ag; and X is Br, and the metal halide perovskite has the formula (Ic):

$$Cs_2SbAgBr_6 \qquad (Ic).$$

In some embodiments, the metal halide perovskite is a lead-free metal halide double perovskite according to formula (I), wherein B is Sb; B' is Au; and X is Br, and the metal halide perovskite has the formula (Id):

$$Cs_2SbAuBr_6 \qquad (Id).$$

In some embodiments, the metal halide perovskite is a lead-free metal halide double perovskite according to formula (I), wherein X is Cl. For example, the lead-free metal halide double perovskite may be selected from a lead-free metal halide double perovskite according to at least one of the following formulas (Ie)-(Ih): $Cs_2BiAgCl_6$ (Ie), $Cs_2BiAuCl_6$ (If), $Cs_2SbAgCl_6$ (Ig), or $Cs_2SbAuCl_6$ (Ih).

In some embodiments, the metal halide perovskite is a lead-free metal halide double perovskite according to formula (I), wherein X is I. For example, the lead-free metal halide double perovskite may be selected from a lead-free metal halide double perovskite according to at least one of the following formulas (Ii)-(Il): $Cs_2BiAgI_6$ (Ii), $Cs_2BiAuI_6$ (Ij), $Cs_2SbAgI_6$ (Ik), or $Cs_2SbAuI_6$ (Il).

In some embodiments, the metal halide perovskite is a metal halide perovskite according to formula (II):

$$ABX_3 \qquad (II),$$

wherein A is a +1 cation, B is a +2 cation, and X is Cl, Br, or I.

In some embodiments, the metal halide perovskite is a metal halide perovskite according to formula (II), wherein A is Cs, B is a +2 cation, and X is Cl, Br, or I.

In some embodiments, the metal halide perovskite is a metal halide perovskite according to formula (II), wherein A is an organic +1 cation. Non-limiting examples of an organic +1 cation include methylammonium or formamidinium.

In some embodiments, the metal halide perovskite is a metal halide perovskite according to formula (II), wherein B is Pb or Sn.

In some embodiments, the metal halide perovskite is a metal halide perovskite according to formula (II), wherein A and B of formula (II) are selected as shown at the following table:

TABLE 1

Embodiments of Metal Halide Perovskites of Formula (II)

| | "B" of Formula (II) | |
| --- | --- | --- |
| "A" of Formula (II) | Pb | Sn |
| Cs | $CsPbX_3$ (IIa) | $CsSnX_3$ (IId) |
| Methylammonium ($CH_3NH_3^+$) | $(CH_3NH_3^+)PbX_3$ (IIb) | $(CH_3NH_3^+)SnX_3$ (IIe) |
| Formamidium ($CH_5N_2^+$) | $(CH_5N_2^+)PbX_3$ (IIc) | $(CH_5N_2^+)SnX_3$ (IIf) |

In some embodiments, the metal halide perovskite is a metal halide perovskite of formula (IIa), (IIb), (IIc), (IId), (IIe), or (IIf) of Table 1, wherein X is Cl. In some embodiments, the metal halide perovskite is a metal halide perovskite of formula (IIa), (IIb), (IIc), (IId), (IIe), or (IIf) of Table 1, wherein X is Br. In some embodiments, the metal halide perovskite is a metal halide perovskite of formula (IIa), (IIb), (IIc), (IId), (IIe), or (IIf) of Table 1, wherein X is I.

In some embodiments, the metal halide perovskite is a metal halide perovskite according to formula (III):

$$A_2BX_4 \qquad (III),$$

wherein A is a +1 cation, B is a +2 cation, and X is Cl, Br, or I. In some embodiments, A is an organic +1 cation. In some embodiments, A is an organic +1 cation that includes at least 4 carbon atoms. In some embodiments, A is an organic +1 cation selected from butylammonium ($C_4H_9NH_3^+$) or benzylammonium ($C_6H_5CH_2NH_3^+$). In some embodiments, B of formula (III) is Pb or Sn.

In some embodiments, the metal halide perovskite is a metal halide perovskite according to formula (III), wherein A and B of formula (III) are selected as shown at the following table:

TABLE 2

Embodiments of Metal Halide Perovskites of Formula (III)

| "A" of Formula (III) | "B" of Formula (III) | |
|---|---|---|
| | Pb | Sn |
| Butylammonium ($C_4H_9NH_3^+$) | $(C_4H_9NH_3^+)_2PbX_4$ (IIIa) | $(C_4H_9NH_3^+)_2SnX_4$ (IIIc) |
| Benzylammonium ($C_6H_5CH_2NH_3^+$) | $(C_6H_5CH_2NH_3^+)_2PbX_4$ (IIIb) | $(C_6H_5CH_2NH_3^+)_2SnX_4$ (IIId) |

In some embodiments, the metal halide perovskite is a metal halide perovskite of formula (IIIa), (IIIb), (IIIc), or (IIId) of Table 2, wherein X is Cl. In some embodiments, the metal halide perovskite is a metal halide perovskite of formula (IIIa), (IIIb), (IIIc), or (IIId) of Table 2, wherein X is Br. In some embodiments, the metal halide perovskite is a metal halide perovskite of formula (IIIa), (IIIb), (IIIc), or (IIId) of Table 2, wherein X is I.

In some embodiments, the metal halide perovskite is a metal halide perovskite according to formula (IV), which may represent Ruddlesden-Popper phase perovskites:

$$A_2A'_nB_{n+1}X_{3n+4} \quad (IV),$$

wherein n is 1 to ∞, A is a +1 cation, A' is a +1 cation, B is a +2 cation, and X is Cl, Br, or I. A' and A may be different. In some embodiments, A is an organic +1 cation that includes at least 4 carbon atoms, and A' is an organic +1 cation that includes 1 to 3 carbon atoms. In formula (IV), "n+1" may equal the number of $BX_6$ octahedral layers.

In some embodiments, A is an organic +1 cation that includes at least 4 carbon atoms, and is selected from butylammonium ($C_4H_9NH_3^+$) or benzylammonium ($C_6H_5CH_2NH_3^+$).

In some embodiments, A' of formula (IV) is an organic +1 cation that includes 1 to 3 carbon atoms, and is selected from methylammonium or formamidinium.

In some embodiments, B of formula (IV) is Pb or Sn.

In some embodiments, the metal halide perovskite is a metal halide perovskite according to formula (IV), wherein A and A' of formula (IV) are selected as shown at the following table:

TABLE 3

Embodiments of Metal Halide Perovskites of Formula (IV)

| "A" of Formula (IV) | "A'" of Formula (IV) | |
|---|---|---|
| | Methylammonium | Formamidinium |
| Butylammonium ($C_4H_9NH_3^+$) | $(C_4H_9NH_3^+)_2(CH_3NH_3^+)_nB_{n+1}X_{3n+4}$ (IVa) | $(C_4H_9NH_3^+)_2(CH_5N_2^+)_nB_{n+1}X_{3n+4}$ (IVc) |
| Benzylammonium ($C_6H_5CH_2NH_3^+$) | $(C_6H_5CH_2NH_3^+)_2(CH_3NH_3^+)_nB_{n+1}X_{3n+4}$ (IVb) | $(C_6H_5CH_2NH_3^+)_2(CH_5N_2^+)_nB_{n+1}X_{3n+4}$ (IVd) |

In some embodiments, the metal halide perovskite is a metal halide perovskite of formula (IVa), (IVb), (IVc), or (IVd) of Table 3, wherein X is Cl, and B is Pb. In some embodiments, the metal halide perovskite is a metal halide perovskite of formula (IVa), (IVb), (IVc), or (IVd) of Table 3, wherein X is Br, and B is Pb. In some embodiments, the metal halide perovskite is a metal halide perovskite of formula (IVa), (IVb), (IVc), or (IVd) of Table 3, wherein X is I, and B is Pb.

In some embodiments, the metal halide perovskite is a metal halide perovskite of formula (IVa), (IVb), (IVc), or (IVd) of Table 3, wherein X is Cl, and B is Sn. In some embodiments, the metal halide perovskite is a metal halide perovskite of formula (IVa), (IVb), (IVc), or (IVd) of Table 3, wherein X is Br, and B is Sn. In some embodiments, the metal halide perovskite is a metal halide perovskite of formula (IVa), (IVb), (IVc), or (IVd) of Table 3, wherein X is I, and B is Sn.

As used herein, the phrases "+1 cation", "+2 cation", "+3 cation", and the like, generally refer to any positively charged species having a net charge of +1, +2, or +3, respectively. The "positively charged species" may include an organic species or inorganic species, and may include a single atom or a molecule. For example, a +1 cation may include an inorganic, single atom +1 cation, such as Cs, or a +1 cation may include an organic molecule, such as methylammonium.

As used herein, the phrase "organic +1 cation" and the like generally refer to any positively charge species having a net charge of +1 that includes at least one carbon atom and at least one non-carbon atom that is positively charged, such as nitrogen. When a nitrogen is positively charged, the positively charged nitrogen may be a primary, secondary, or tertiary nitrogen, and may be covalently bonded to any one, two, or three carbon atoms of an "organic +1 cation."

In some embodiments, the "organic +1 cation" is a $C_1$-$C_{20}$ hydrocarbyl, a $C_4$-$C_{20}$ hydrocarbyl, a $C_1$-$C_3$ hydrocarbyl, or a $C_1$ hydrocarbyl that includes at least one non-carbon atom that is positively charged. In some embodiments, the "organic +1 cation" is a $C_1$-$C_{20}$ hydrocarbyl, a $C_4$-$C_{20}$ hydrocarbyl, a $C_1$-$C_3$ hydrocarbyl, or a $C_1$ hydrocarbyl that includes at least one nitrogen atom that is positively charged. A $C_1$-$C_{20}$ hydrocarbyl, a $C_4$-$C_{20}$ hydrocarbyl, a $C_1$-$C_3$ hydrocarbyl, or a $C_1$ hydrocarbyl may be substituted with at least one non-carbon atom that is positively charged (i.e., a hydrogen atom of the $C_1$-$C_{20}$ hydrocarbyl, the $C_4$-$C_{20}$ hydrocarbyl, the $C_1$-$C_3$ hydrocarbyl, or the $C_1$ hydrocarbyl may be replaced with the at least one non-carbon atom that is positively charged), and/or the at least one non-carbon atom that is positively charged may be bonded to at least two carbon atoms of the $C_1$-$C_{20}$ hydrocarbyl, the $C_4$-$C_{20}$ hydrocarbyl, the $C_1$-$C_3$ hydrocarbyl, or the $C_1$ hydrocarbyl.

The phrases "$C_1$-$C_{20}$ hydrocarbyl", "$C_4$-$C_{20}$ hydrocarbyl", "$C_1$-$C_3$ hydrocarbyl", "$C_1$ hydrocarbyl" and the like, as used herein, generally refer to aliphatic, aryl, or arylalkyl groups containing 1 to 20, 4 to 20, 1 to 3, or 1 carbon atoms. Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having 1 to about 20 carbon atoms, 4 to 20 carbon atoms, 1 to 3 carbon atoms, or 1 carbon atom, etc. Examples of alkyl groups include, but are not limited to, methyl, ethyl, propyl, isopropyl, n-butyl, t-butyl, isobutyl, pentyl, hexyl, isohexyl, heptyl, 4,4-dimethylpentyl, octyl, 2,2,4-trimethylpentyl, nonyl, decyl, undecyl and dodecyl. Cycloalkyl moieties may be monocyclic or multicyclic, and examples include cyclopropyl, cyclobutyl, cyclopentyl, cyclohexyl, and adamantyl. Additional examples of alkyl moieties have linear, branched and/or cyclic portions (e.g., 1-ethyl-4-methyl-cyclohexyl). Representative alkenyl moieties include vinyl, allyl, 1-butenyl, 2-butenyl, isobutylenyl, 1-pentenyl, 2-pentenyl, 3-methyl-1-butenyl, 2-methyl-2-butenyl, 2,3-dimethyl-2-butenyl, 1-hexenyl, 2-hexenyl, 3-hexenyl, 1-heptenyl, 2-heptenyl, 3-heptenyl, 1-octenyl, 2-octenyl, 3-octenyl, 1-nonenyl, 2-nonenyl, 3-nonenyl, 1-decenyl, 2-decenyl and 3-decenyl. Representative alkynyl moieties include acetylenyl, propynyl, 1-butynyl, 2-butynyl, 1-pentynyl, 2-pentynyl, 3-methyl-1-butynyl, 4-pentynyl, 1-hexynyl, 2-hexynyl, 5-hexynyl, 1-heptynyl, 2-heptynyl, 6-heptynyl, 1-octynyl, 2-octynyl, 7-octynyl, 1-nonynyl, 2-nonynyl, 8-nonynyl, 1-decynyl, 2-decynyl and 9-decynyl. Examples of aryl or arylalkyl moieties include, but are not limited to, anthracenyl, azulenyl, biphenyl, fluorenyl, indan, indenyl, naphthyl, phenanthrenyl, phenyl, 1,2,3,4-tetrahydro-naphthalene, tolyl, xylyl, mesityl, benzyl, and the like, including any heteroatom substituted derivative thereof.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl, ethyl, propyl, t-butyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), aryl, aryloxy, azo, carbamoyl (—NHC(O)O-alkyl- or —OC(O)NH-alkyl), carbamyl (e.g., $CONH_2$, as well as CONH-alkyl, CONH-aryl, and CONH-arylalkyl), carboxyl, carboxylic acid, cyano, ester, ether (e.g., methoxy, ethoxy), halo, haloalkyl (e.g., $—CCl_3$, $—CF_3$, $—C(CF_3)_3$), heteroalkyl, isocyanate, isothiocyanate, nitrile, nitro, phosphodiester, sulfide, sulfonamido (e.g., $SO_2NH_2$, $SO_2NR'R''$), sulfone, sulfonyl (including alkylsulfonyl, arylsulfonyl and arylalkylsulfonyl), sulfoxide, thiol (e.g., sulfhydryl, thioether) or urea (—NHCONH-alkyl-).

Polymer Matrix

The polymer matrix of the composite materials provided herein generally may include any polymer that is compatible with the metal halide perovskites.

The term "polymer", as used herein, refers to any material that includes a monomer repeat unit, such as polymers, oligomers, and co-polymers, including any cross-linked derivatives thereof. The polymers, oligomers, and co-polymers may be linear, branched, comb-shaped, star-shaped, etc.

In some embodiments, the polymer matrix includes a polymer that includes at least one hydroxyl functional group. A polymer may include at least one monomer repeat unit having a side chain that includes at least one hydroxyl functional group. A polymer may have an end group that is or includes at least one hydroxyl functional group. A polymer may include at least one monomer repeat unit having a side chain that includes at least one hydroxyl functional group, and an end group that is or includes at least one hydroxyl functional group.

Not wishing to be bound by any particular theory, it is believed that polymers containing hydroxyl functional groups may promote or facilitate the formation of composite materials in which a metal halide perovskite is evenly or substantially evenly dispersed, including films, particularly when the metal halide perovskite is a lead-free metal halide double perovskite, such as $Cs_2AgBiBr_6$. A polymer that includes at least one hydroxyl functional group may, for example, facilitate the formation of composite materials films in which large embedded grains of a lead-free metal halide double perovskite, such as $Cs_2AgBiBr_6$, are evenly or substantially evenly dispersed. Polymers without hydroxyl functional groups can be used, however, alone or in combination with polymers that include at least one hydroxyl functional group.

In some embodiments, the polymer matrix includes a polymer selected from polyethylene oxide (PEO), polymethylmethacrylate (PMMA), polyvinylidene difluoride (PVDF), polyvinyl alcohol (PVA), polylactic acid (PLA), polystyrene, acrylonitrile butadiene styrene (ABS), or a combination thereof. In some embodiments, the polymer matrix includes a polymer selected from polyethylene oxide (PEO), polymethylmethacrylate (PMMA), polyvinylidene difluoride (PVDF), polyvinyl alcohol (PVA), or a combination thereof.

The polymer of the polymer matrix generally may have any molecular weight that does not undesirably impact the formation of a composite material. In some embodiments, the polymer has a weight average molecular weight ($M_w$) of about 50 K to about 750 K. In some embodiments, the polymer has a weight average molecular weight ($M_w$) of about 50 K to about 650 K. In some embodiments, the polymer has a weight average molecular weight ($M_w$) of about 50 K to about 400 K. In some embodiments, the polymer has a weight average molecular weight ($M_w$) of about 50 K to about 200 K. In some embodiments, the polymer has a weight average molecular weight ($M_w$) of about 50 K to about 150 K. In some embodiments, the polymer has a weight average molecular weight ($M_w$) of about 100 K.

Devices

Also provided herein are devices that include a composite material. The devices generally include a first electrode, a second electrode, and a composite material described herein. The composite material of the devices may be a film. The devices also may include one or more additional layers, such as a hole blocking layer. The hole blocking layer may be arranged between the composite material and one of the first electrode and the second electrode.

In some embodiments, the devices described herein include a first electrode; a second electrode; and a composite material described herein, wherein the composite material is a film, and the film is arranged between the first electrode and the second electrode. In some embodiments, the film is arranged between and in contact with at least one of the first electrode and the second electrode.

A schematic of an embodiment of a device is depicted at FIG. 1A. The device 100 of FIG. 1A includes a first electrode 101, a composite material film 102, and a second electrode 103. The composite material film 102 is arranged between and in contact with both the first electrode 101 and the second electrode 103.

The first electrode and the second electrode of the devices generally may include any known materials, and may have any configuration. In some embodiments, at least one of the first electrode and the second electrode includes a plurality of discrete electrode segments.

Figure 1B:
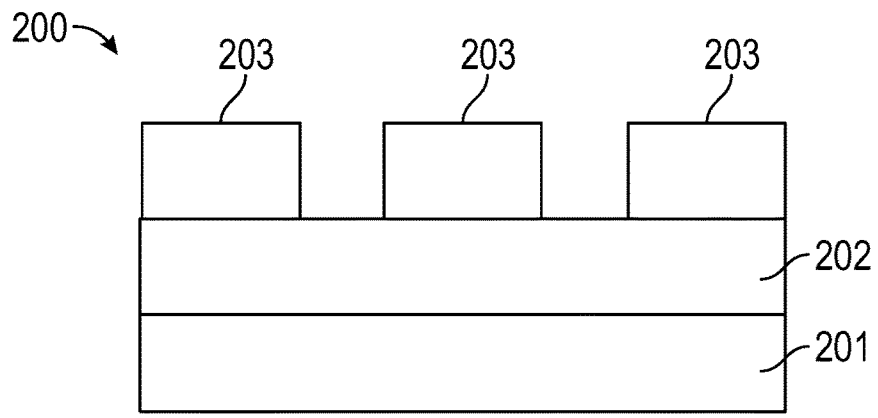
FIG. 1B depicts an embodiment of a device described herein that includes a plurality of discrete electrode segments.

A schematic of an embodiment of a device is depicted at FIG. 1B. The device 200 of FIG. 1B includes a first electrode 201, a composite material film 102, and a second electrode that includes a plurality of discrete electrode segments 203.

The composite material film 202 is arranged between and in contact with both the first electrode 201 and the second electrode 203.

In some embodiments, the devices include a first electrode, a second electrode, and a film of a composite material described herein, the film having a first side and a second side, wherein the first electrode and the second electrode are arranged on the first side of the film. The distance between the first electrode and the second electrode may be about 100 μm to about 500 μm. Such a configuration may be referred to as a surface planar structured device configuration.

Figure 1C:
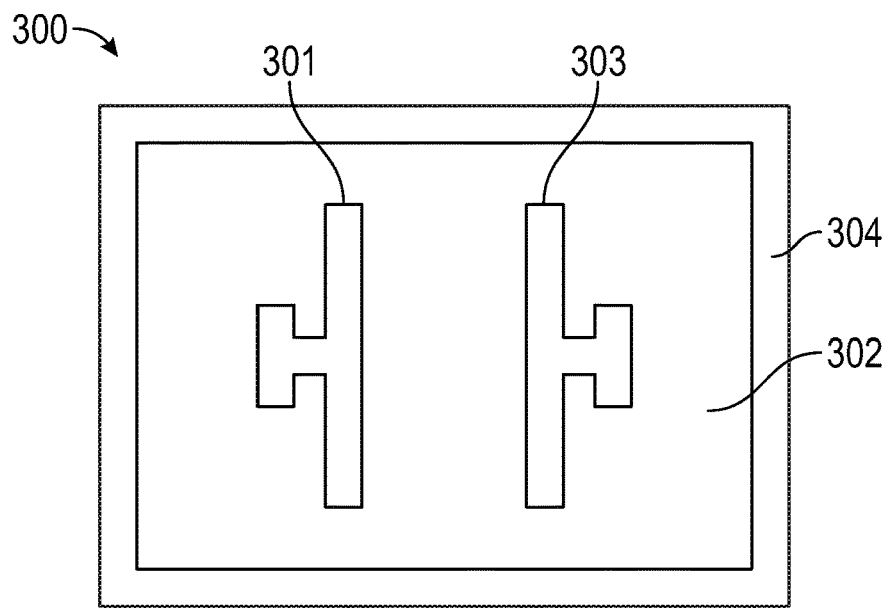
FIG. 1C depicts an embodiment of a device described herein.
Figure 7A:
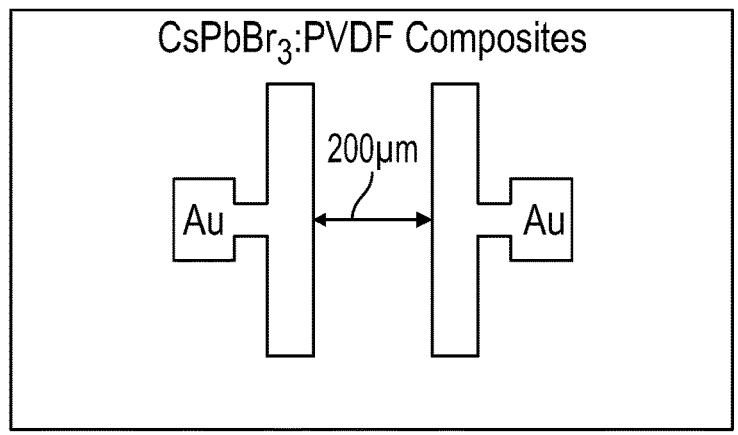
FIG. 7A depicts a schematic of an embodiment of a device.
Figure 7B:
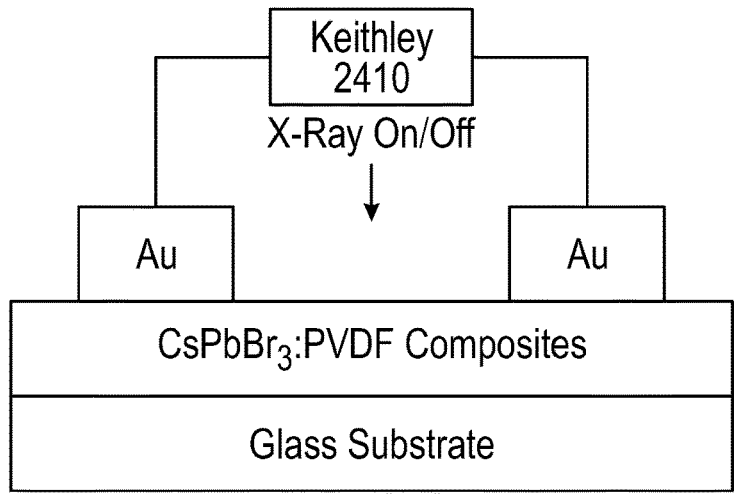
FIG. 7B is a cross-sectional view of the device of FIG. 7A.
Figure 7C:
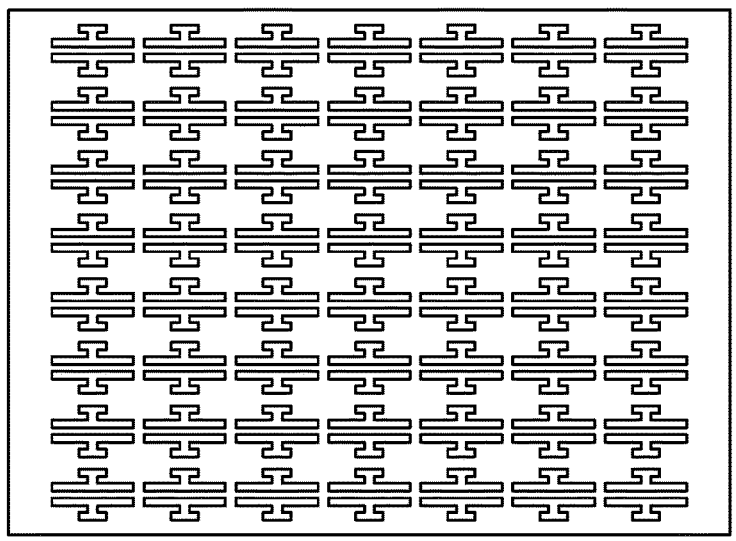
FIG. 7C is a plan view of an array of the devices depicted at FIG. 7A.

A schematic of an embodiment of a device is depicted at FIG. 1C. The device 300 of FIG. 1C includes a composite material film 302 onto which a first electrode 301 and a second electrode 303 are arranged. The composite material film 302 is arranged on a substrate 304. Another embodiment of a device having such an arrangement is depicted at FIG. 7A, FIG. 7B, and FIG. 7C.

The first electrode and the second electrode of the devices described herein may include the same material or different materials. The first electrode and/or the second electrode may include a metal (e.g., gold, silver, etc.) and/or carbon (e.g., C60, etc.) In some embodiments, at least one of the first electrode and the second electrode include a vacuum evaporated layer of a metal, such as gold. In some embodiments, the first electrode and the second electrode include gold. In some embodiments, the first electrode is a film, and the second electrode includes a plurality of discrete electrode segments that include a screen-printed metal paste, such as a screen-printed silver paste.

The devices provided herein may include an electromagnetic radiation detector. For example, the devices provided herein may include X-ray detectors, gamma-ray detectors, etc.

In some embodiments, the devices herein include X-ray detectors, and the X-ray detectors have a sensitivity of about 30 $\mu C\ Gy_{air}^{-1}\ cm^{-2}$ to about 50 $\mu C\ Gy_{air}^{-1}\ cm^{-2}$ at 400 V bias.

In some embodiments, the devices herein (i) are X-ray detectors, (ii) include a 100 μm-thick film of a composite material described herein, (iii) exhibit a sensitivity of about 30 $\mu C\ Gy_{air}^{-1}\ cm^{-2}$ to about 50 $\mu C\ Gy_{air}^{-1}\ cm^2$ at 400 V bias, and (iv) can be bent to have a radius of about 1 mm to about 3 mm without degrading the photocurrent.

In some embodiments, the devices described herein are gamma-ray detectors, and include a 2 mm-thick film of a composite material described herein, or a rod having a diameter of about 10 mm to about 20 mm, or about 16 mm.

Methods

Methods also are provided for making the composite materials herein. In some embodiments, the methods include providing a mixture including CsX, BX, B'X, a polymer, and a liquid; and evaporating the liquid to form the composite material; wherein B is Sb or Bi, B' is Cu, Ag, or Au, and X is Cl, Br, or I.

In some embodiments, the molar ratio of CsX to BX to B'X in the mixture is about 1.5-2.5:0.5-1.5:0.5-1.5. In some embodiments, the molar ratio of CsX to BX to B'X in the mixture is about 2:1:1. The liquid may be any liquid, including a solvent for one or more components of the mixture, such as dimethylsulfoxide (DMSO).

In some embodiments, evaporating the liquid to form the composite material includes disposing the mixture on a substrate, and heating the mixture. The methods may also include peeling the composite material off the substrate.

Methods also are provided of making the devices described herein. In some embodiments, the methods include printing with a 3D printer a film of a composite material described herein on a substrate. The film may have a first side and a second side, and the first side of the film may be in contact with the substrate after the printing of the film. In some embodiments, the substrate includes a first electrode, which may also be printed with a 3D printer. In some embodiments, the methods also include printing with a 3D printer a second electrode on the second side of the film. The second electrode may be a film, or the second electrode made include a plurality of discrete electrode segments. In some embodiments, the substrate includes a glass substrate.

A commercially available 3D printer may be used to print the composite materials and/or electrodes of the devices described herein. Other suitable additive manufacturing equipment and methods known in the art also may be used to build the devices disclosed herein.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of various embodiments, applicants in no way disclaim these technical aspects, and it is contemplated that the present disclosure may encompass one or more of the conventional technical aspects discussed herein.

The present disclosure may address one or more of the problems and deficiencies of known methods and processes. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

In the descriptions provided herein, the terms "includes," "is," "containing," "having," and "comprises" are used in an open-ended fashion, and thus should be interpreted to mean "including, but not limited to." When methods and composite materials are claimed or described in terms of "comprising" various components or steps, the composite materials and methods can also "consist essentially of" or "consist of" the various components or steps, unless stated otherwise.

The terms "a," "an," and "the" are intended to include plural alternatives, e.g., at least one. For instance, the disclosure of "a polymer," "a liquid," "a metal halide perovskite", and the like, is meant to encompass one, or mixtures or combinations of more than one polymer, liquid, metal halide perovskite, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, all numerical end points of ranges disclosed herein are approximate. As a representative example, Applicant discloses, in some embodiments, that the film has a thickness of about 75 µm to about 125 µm. This range should be interpreted as encompassing thicknesses of about 75 µm to about 125 µm, and further encompasses "about" each of 76 µm, 77 µm, µm, 78 µm, 79 µm, 80 µm, 81 µm, 82 µm, 83 µm, 84 µm, 85 µm, 86 µm, 87 µm, 88 µm, 89 µm, 90 µm, 91 µm, 92 µm, 93 µm, 94 µm, 95 µm, 96 µm, 97 µm, 98 µm, 99 µm, 100 µm, 101 µm, 102 µm, 103 µm, 104 µm, 105 µm, 106 µm, 107 µm, 108 µm, 109 µm, 110 µm, 111 µm, 112 µm, 113 µm, 114 µm, 115 µm, 116 µm, 117 µm, 118 µm, 119 µm, 120 µm, 121 µm, 122 µm, 123 µm, and 124 µm, including any ranges and sub-ranges between any of these values.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

The following materials were used in the examples, unless otherwise noted. Cesium bromide (CsBr, 99.9%), silver bromide (AgBr, 99%), bismuth(III) bromide ($BiBr_3$, ≥98%), dimethyl sulfoxide (DMSO, anhydrous, 99.9%), poly(ethylene oxide) (PEO, average $M_w$ ~100,000, 600,000, and 1,000,000), poly(vinyl alcohol) (PVA, $M_w$ 89,000-98,000, >99% hydrolyzed), poly(vinylidene fluoride) (PVDF, $M_w$ ~530,000), poly(methyl methacrylate) (PMMA, $M_w$ ~15,000, 120,000, and 350,000), and poly(2-hydroxyethyl methacrylate) (PHMA, $M_w$ ~300,000) were purchased from Sigma-Aldrich. All materials were used as received.

Example 1—Film Preparation and Characterizations

The halide perovskite-polymer composite films of this example were obtained by a solution-cast and vacuum-dry process on a cleaned glass substrate.

The glass substrates were cleaned with detergent water, sonicated for 10 minutes each in acetone, isopropyl alcohol (IPA) and distilled water and then blow dried with nitrogen. Cleaned glass substrates were treated with oxygen plasma at 100 W power for 3 minutes.

CsBr, AgBr and $BiBr_3$ were mixed with 2:1:1 molar ratio and dissolved in DMSO with a concentration of 200 mg/mL. The polymers were also dissolved in DMSO and mixed with the perovskite precursor solution at a 1:2 weight ratio (polymer/$Cs_2AgBiBr_6$). The solution was then poured onto a cleaned glass substrate and dried inside a vacuum oven at 150° C. for 12 hours.

The dried film was peeled off from the glass substrate and used for material characterizations and X-ray detector fabrication. Field Emission scanning electron microscopy (SEM) (JEOL®-7401F SEM), UV-Vis-NIR spectrometer (VARIAN® CARY 5000® spectrometer), X-ray diffraction (XRD) (X'PERT® Pro XRD with Cu Kα radiation source), and a fluorometer (HORIBA® JY FLUOROMAX-4®) were used to characterize the composite thin films.

Polyethylene oxide (PEO), polymethylmethacrylate (PMMA), polyvinylidene difluoride (PVDF), and polyvinyl alcohol (PVA) were first tested for dispersing the $Cs_2AgBiBr_6$ crystals. All composite films of this example had a perovskite:polymer weight ratio of 2:1.

Optical images of the pristine perovskite and perovskite-polymer composite films of this example were collected. The samples included (a) halide double perovskite ($Cs_2AgBiBr_6$) only, and $Cs_2AgBiBr_6$-polymer composite films with b) PEO ($M_w$ ~1,000,000), c) PMMA ($M_w$ ~120,000), d) PVDF ($M_w$ ~530,000), e) PVA ($M_w$ 89,000-98,000), and f) PHMA ($M_w$ ~300,000). If no polymer was present, scattered $Cs_2AgBiBr_6$ crystals or aggregates grew and the resulting film was highly non-uniform.

PVA produced the most uniform film in this example, and not wishing to be bound by any particular theory it was hypothesized that the hydroxyl groups in the PVA increased the favorable interactions with the halide perovskites.

To verify this hypothesis, poly(2-hydroxyethyl methacrylate), PHMA, was also tested. Compared to PMMA, PHMA has a similar chemical structure, but PHMA has additional hydroxyl functional groups on the side chains.

The optical images revealed that the composite film that included PHMA had better uniformity than the composite film that included PMMA polymer, thereby confirming that, at least in some samples, the hydroxyl groups facilitated the production of, or at least increased the likelihood of producing, homogenous halide perovskite/polymer composite films.

PEO polymers with different molecular weights were also tested. Optical images of solution-casted $Cs_2AgBiBr_6$-polymer composite films with a) PEO ($M_w$ ~600,000), b) PEO ($M_w$ ~100,000), c) PMMA ($M_w$ ~15,000), and d) PMMA ($M_w$ ~350,000) reveled that the composite film became more uniform as the molecular weight of the PEO was decreased from about 600,000 g/mol to about 100,000 g/mol.

It is believed that the PEO of a lower molecular weight exhibited a higher concentration of hydroxyl groups located at both ends of each polymer chain. In comparison, PMMA polymers with different molecular weights all exhibited relatively poor film uniformity. It is believed that this finding demonstrated that the resulting film morphology was independent of the molecular weight of the polymer when the polymer included no hydroxyl groups.

In this example, the separation of the thick composite films from the substrate was easily achieved by peeling the films off the substrate.

Optical images were collected of (a) a 100 µm-thick $Cs_2AgBiBr_6$/PVA (2:1 weight ratio) film, and b) the same film with electrical contacts formed of a screen-printed conductive silver paste. The electrical contacts were in the shape of the letters "FSU", but other shapes are possible. Also collected were SEM top and cross-section images of the composite film.

The 100 µm-thick $Cs_2AgBiBr_6$/PVA (2:1 weight ratio) film also was bent. When bent, the film had a radius of curvature of about 1 cm, which demonstrated its mechanical flexibility. The film also tolerated many volatile organic solvents, including toluene, alcohol, and acetone.

Metallization of the film was easily carried out in this example using commercially-available conductive silver paste, which was applied directly to the film. The ability to do so can be highly advantageous for a number of applications, including the scalable manufacturing of pixelated detector arrays for X-ray imaging.

The silver paste contact electrodes were fabricated via brushing PELCO® Conductive Silver Paint (16062), and the paint was allowed to dry for six hours at 60° C.

Also collected were SEM top and cross-section images of the composite film, which permitted an analysis of its microscopic morphology. The top surface of the film included fused grains having dimensions ranging from less than 1 micrometer to a few micrometers. The grains had improved surface coverage compared with the pristine perovskite film, leaving only a small areal fraction of holes with sizes ranging from sub-100 nm to about 1 µm. These holes did not extend through the film according to cross-sectional SEM images.

Larger perovskite crystals (having an average largest dimension of from about 20 µm to about 100 µm were observed beneath the film surface, and a large portion of these crystals were interconnected with each other from the bottom of the film to the top surface. This configuration may have provided pathways for charge carrier mobility.

The size difference of perovskite grains on the top surface of the film and those inside the film could possibly be attributed to the solvent evaporation kinetics during film preparation. The top layer of the film dried first and formed a capping layer that may have reduced the solvent evaporation rate for the remaining solution, thereby reducing nucleation densities and resulting in the precipitation of relatively larger sized crystals inside the thick film.

Large grains can be advantageous in certain polycrystalline semiconductor films due at least to reduced grain boundary defects, and the photo-excited charge carriers can be more efficiently collected in X-ray detectors.

Example 2—Characterization of Materials

Field Emission scanning electron microscopy (SEM) (JEOL®-7401F SEM), UV-Vis-NIR spectrometer (VARIAN® CARY 5000® spectrometer), X-ray diffraction (XRD) (X'PERT® Pro XRD with Cu Kα radiation source), and a fluorometer (HORIBA® JY FLUOROMAX-4®) were used to characterize the composite thin films of Example 1.

Figure 2A:
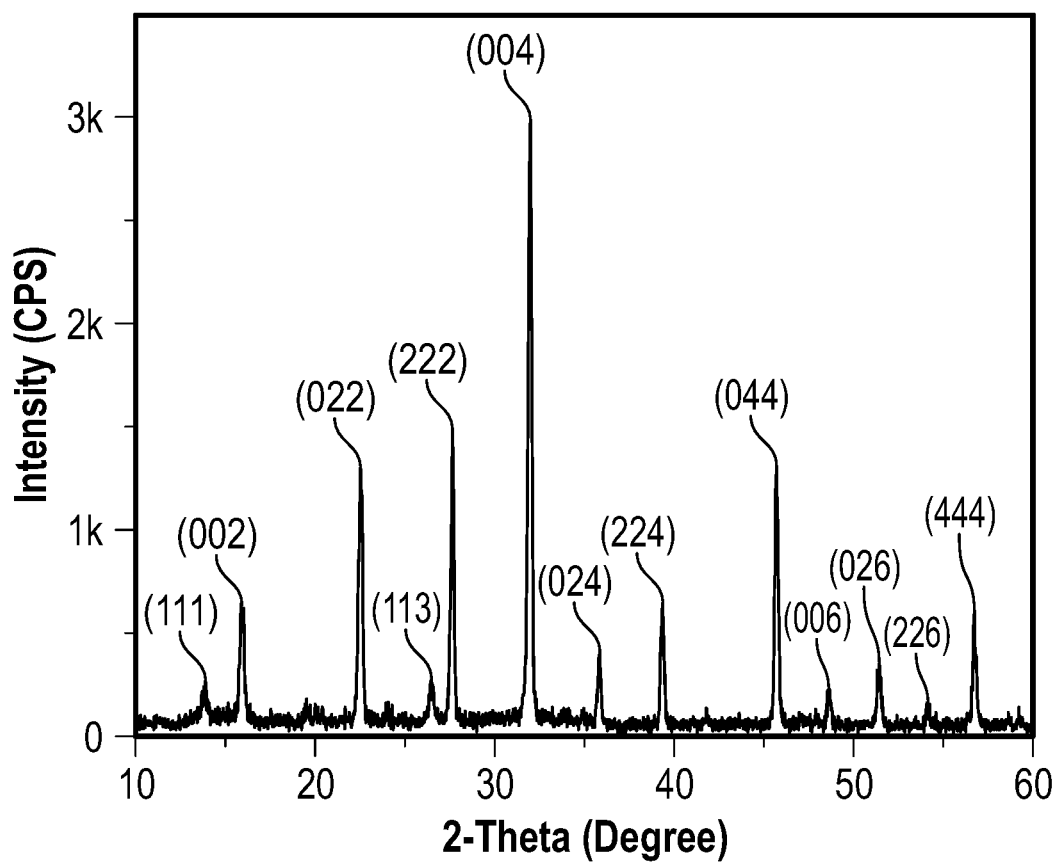
FIG. 2A depicts an X-ray diffraction pattern of an embodiment of a composite material.
Figure 2B:
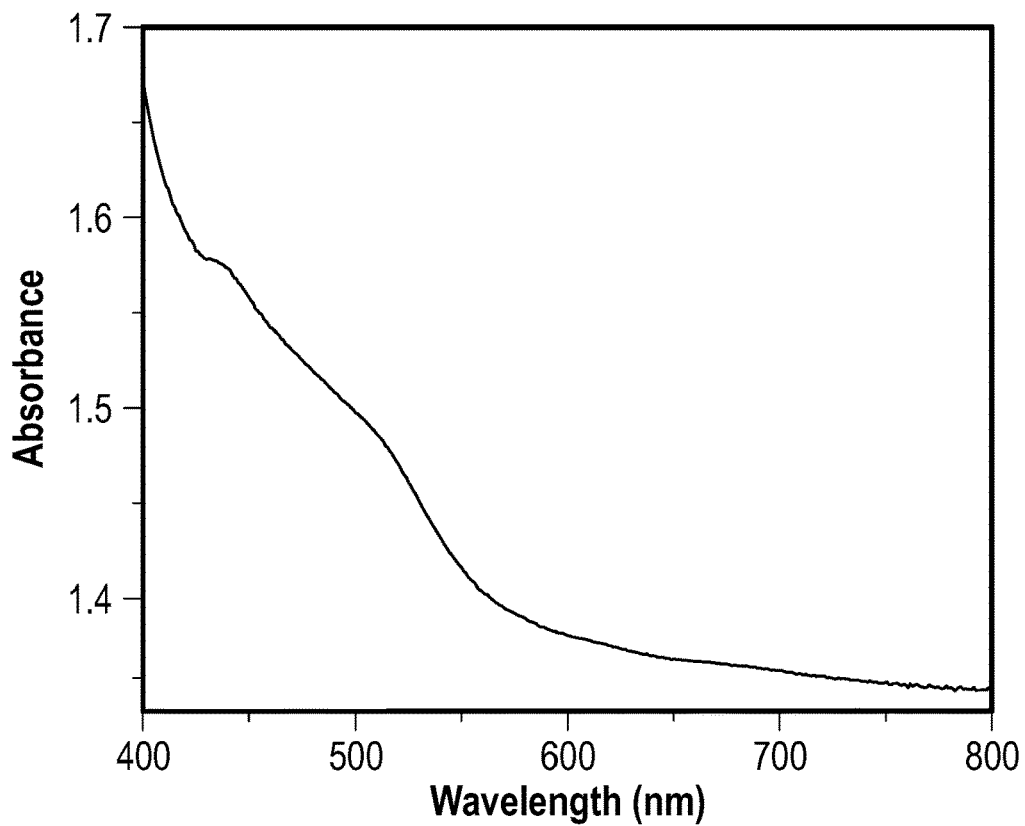
FIG. 2B depicts the absorbance of an embodiment of a composite material.
Figure 2C:
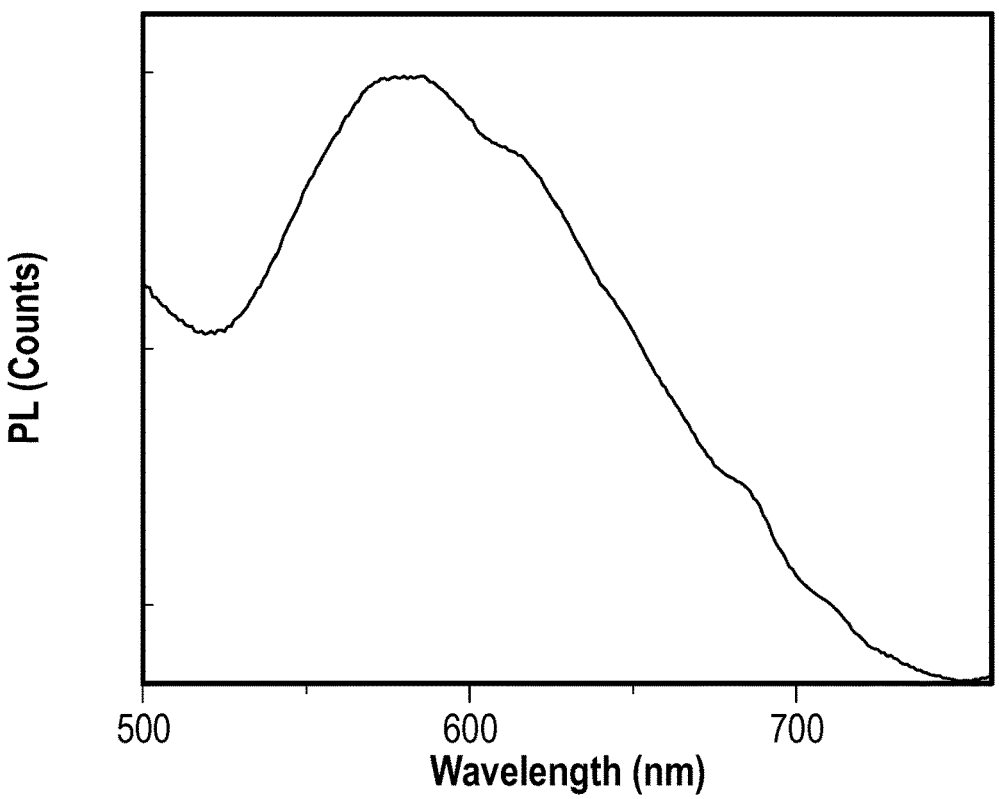
FIG. 2C depicts a photoluminescence spectrum of an embodiment of a composite material.

FIG. 2A, FIG. 2B, and FIG. 2C depict an XRD pattern (FIG. 2A), the absorbance (FIG. 2B), and a photoluminescence (PL) spectrum (FIG. 2C) of the $Cs_2AgBiBr_6$/PVA (2:1 weight ratio) composite film of Example 1.

As depicted at FIG. 2A, the $Cs_2AgBiBr_6$/PVA film exhibited the characteristic diffraction peaks of cubic phase $Cs_2AgBiBr_6$ with a lattice constant of 11.2 Å, which was in good agreement with results from the literature (see Pan, W. C. et al. *Nature Photonics* 2017, 11 (11), 726; and McClure, E. T. et al. *Chemistry of Materials* 2016, 28 (5), 1348-1354).

The absorbance (FIG. 2B) of the film of Example 1 exhibited a gradual increase starting at around 600 nm towards shorter wavelengths, which indicated an indirect electronic band gap of $Cs_2AgBiBr_6$. The PL spectrum (FIG. 2C) exhibited an emission peak at about 580 nm, which corresponded to a band gap of about 2.1 eV for the $Cs_2AgBiBr_6$ crystals in the composite film. This value was also consistent with $Cs_2AgBiBr_6$ single crystals (see, e.g., Pan, W. C. et al. Nature Photonics 2017, 11 (11), 726).

Example 3—X-Ray Detector Fabrication and Measurement

The X-ray responses of the composite films were characterized in this example.

According to the procedure of this example, a vacuum evaporated gold (Au) thin film was used as the top contact, a free-standing $Cs_2AgBiBr_6$/PVA composite film of Example 1 was as the X-ray absorber, and another layer of vacuum evaporated Au thin film was used as the bottom contact.

Figure 3A:
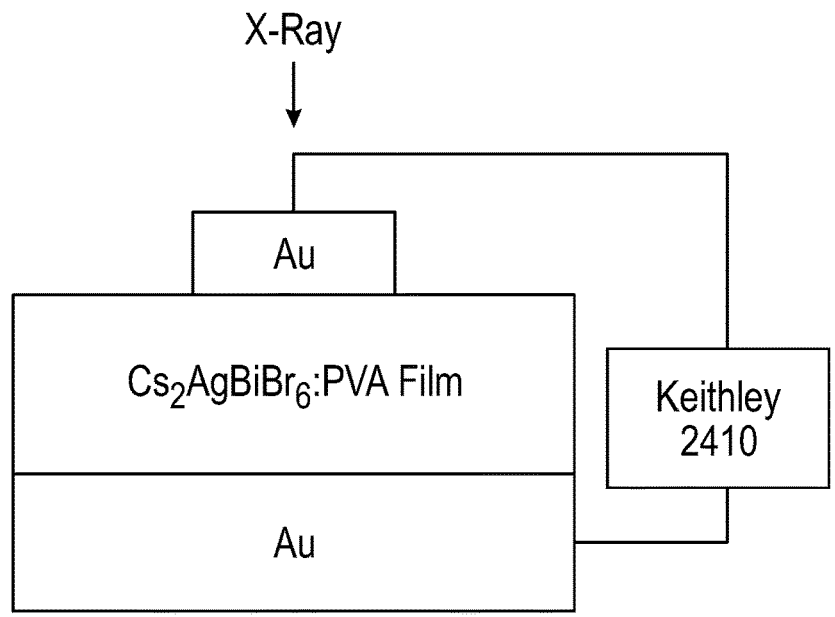
FIG. 3A depicts a schematic of an embodiment of a device that includes an embodiment of a composite material.

FIG. 3A depicts a schematic of the devices of this example, which were X-ray detectors that included the $Cs_2AgBiBr_6$/PVA composite films of Example 1 as X-ray photoconductors.

Figure 3B:
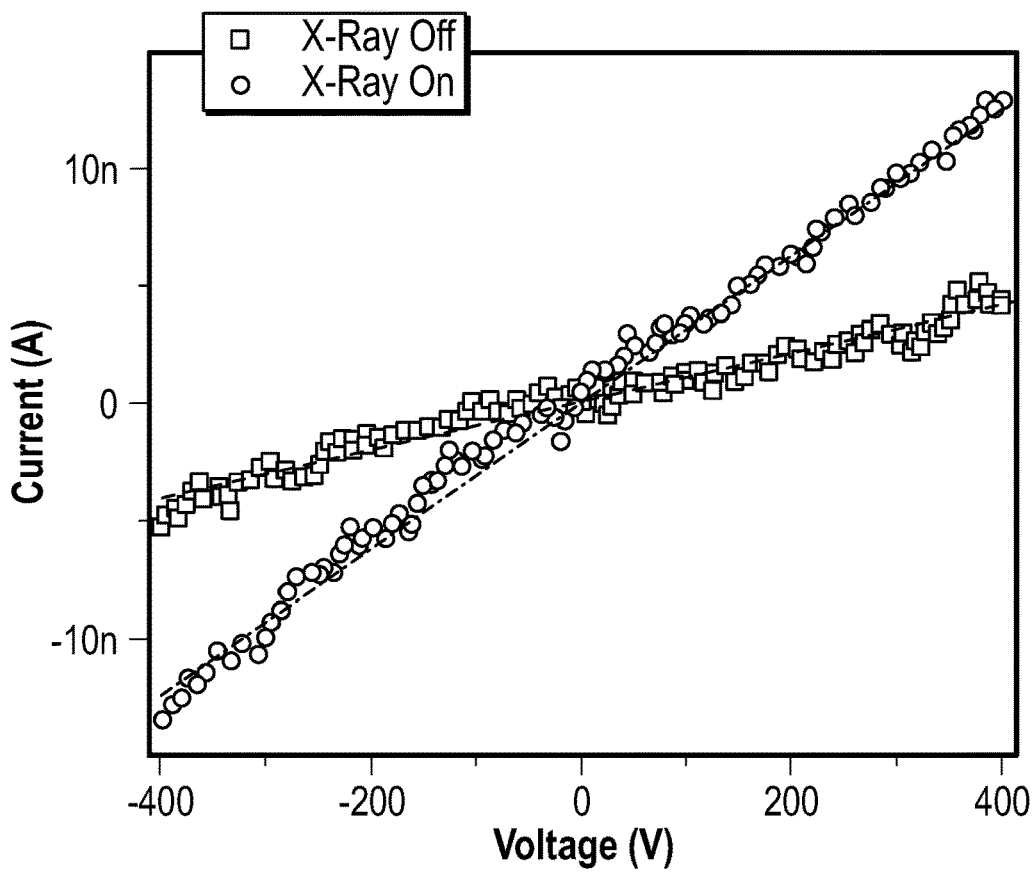
FIG. 3B depicts the current-voltage (I-V) characteristics of an embodiment of a device in X-ray on and off states.

FIG. 3B depicts the current-voltage (I-V) characteristics of a detector with a 100 µm-thick $Cs_2AgBiBr_6$/PVA composite film at both X-ray on and off states. The dotted lines are a linear fitting of the I-V curves.

Figure 3C:
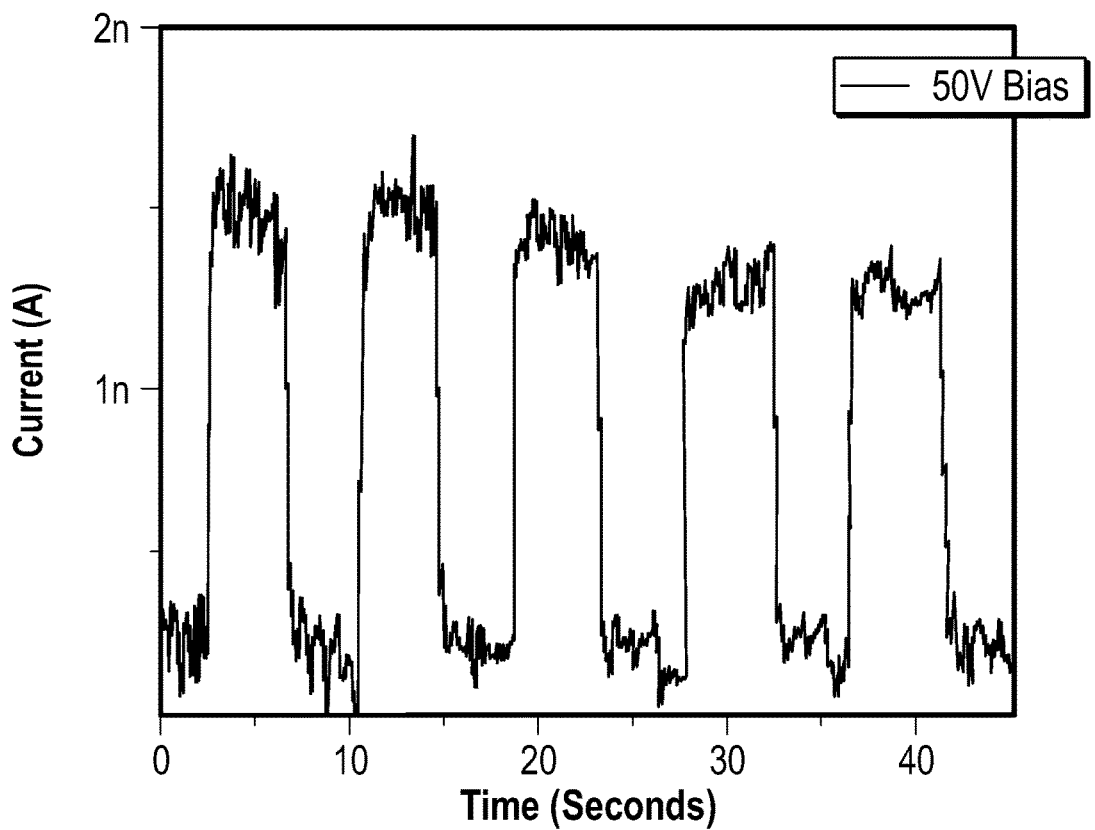
FIG. 3C, FIG. 3D, and FIG. 3E depict the transient responses of an embodiment of a device at 50V (FIG. 3C), 100V (FIG. 3D), and 400V (FIG. 3E).
Figure 3D:
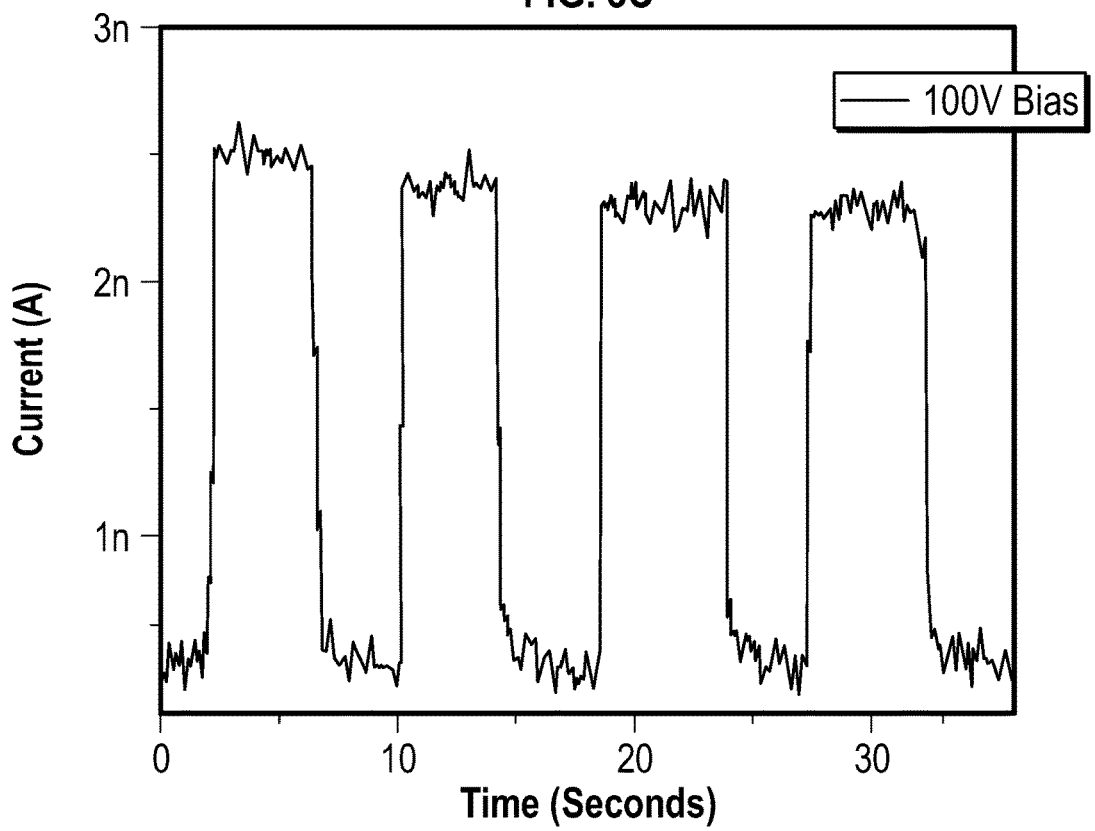
Figure 3E:
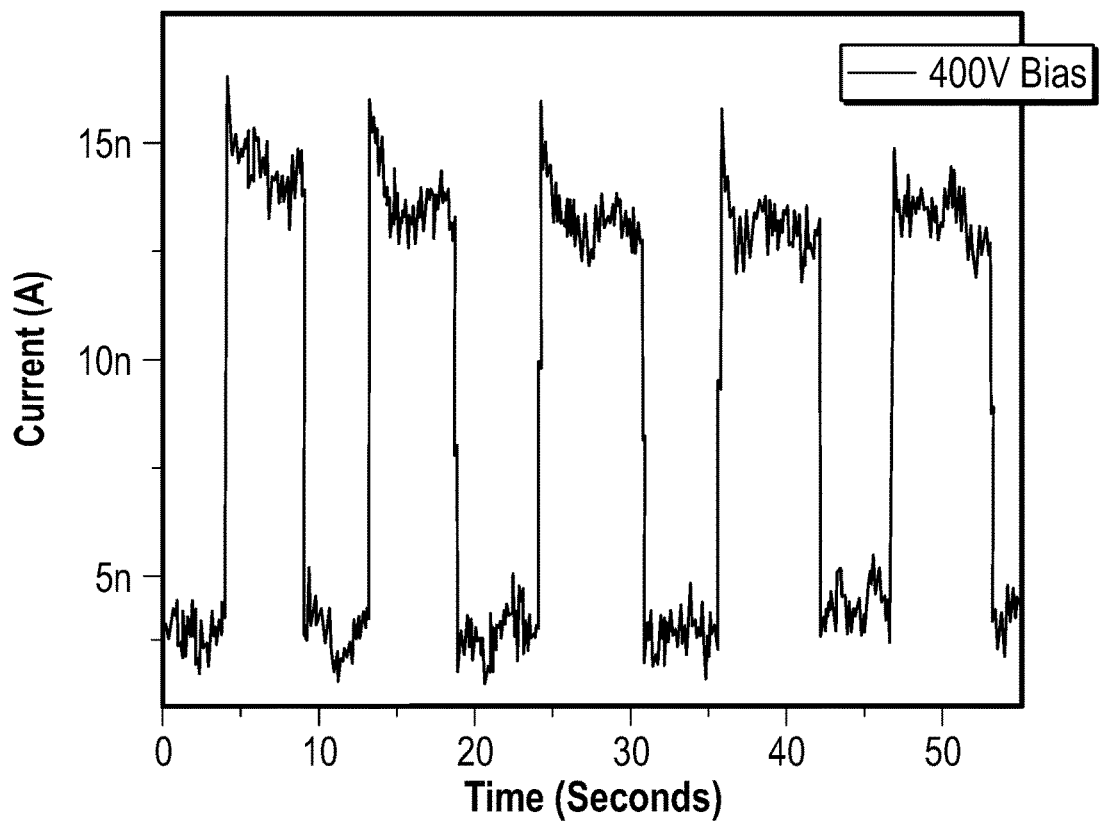

FIG. 3C, FIG. 3D, and FIG. 3E depict the transient responses of the detector at a constant 50V (FIG. 3C), 100V (FIG. 3D), and 400V (FIG. 3E).

Figure 3F:
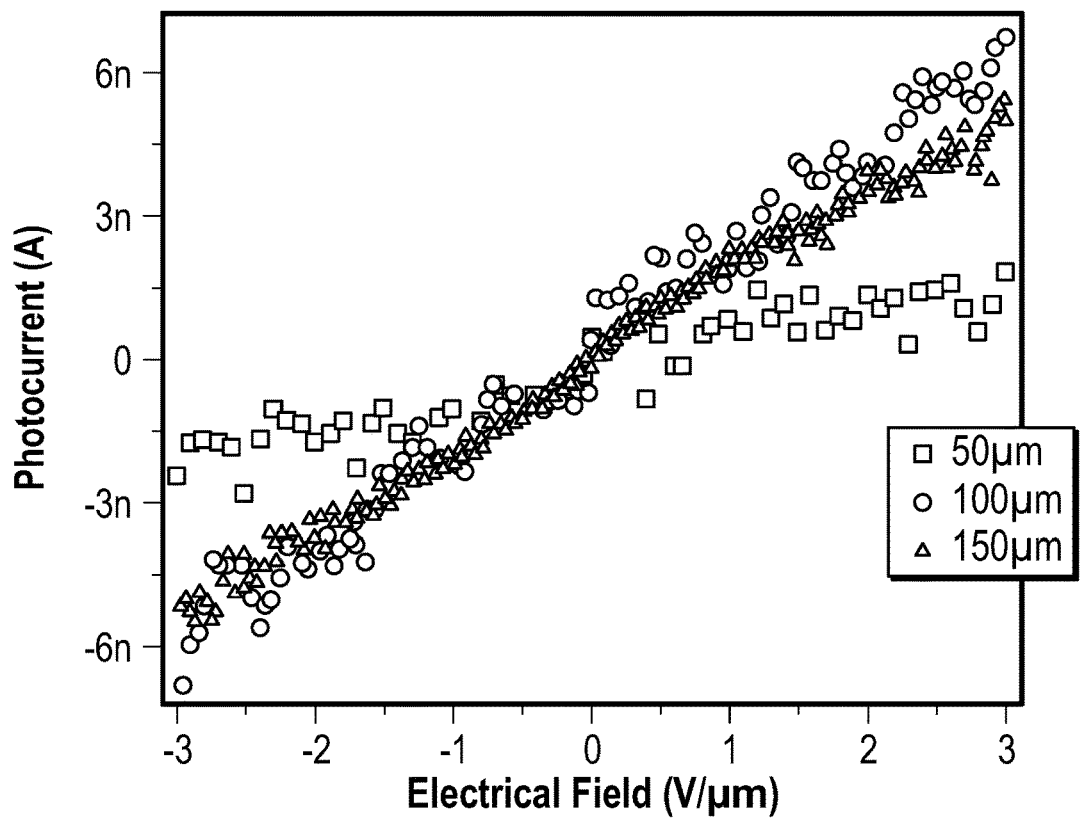
FIG. 3F depicts the photocurrent-electrical field characteristics of embodiments of devices that include films of composite materials having thicknesses of 50 μm, 100 μm, and 150 μm.

FIG. 3F depicts the photocurrent-electrical field characteristics of the X-ray detectors that included 50 µm-thick, 100 µm-thick, and 150 µm-thick composite films.

The Au contact electrodes of this example were deposited in a vacuum thermal evaporator at a rate of 0.5 Å/s under $10^{-6}$ Torr.

Contact masks were used to define the electrode shape in thermal evaporation and screen printing. X-ray detection properties of the films were investigated using a standard fine-focus copper X-ray tube mounted in a SCINTAG® PAD-V diffractometer, energized at 45 kV and 22.2 mA (1 kW electrical load). The spectrum of the tube consisted of a white background with a cut-off at 45 kV, and the spectral lines of Cu Kα and Kβ, as well as tungsten L-lines. No filter was applied.

Specifically, X-ray irradiation was generated by a commercial s-ray copper tube (SCINTAG® PAD-V diffractometer) at 45 kV and 22.2 mA (1 kW electrical load). The integrated emission intensity was calibrated as 13.8 $mGy_{air}$/s using a Geiger counter.

Current-Voltage (I-V) characteristics were recorded with the X-ray beam in both on and off states. FIG. 3B depicts the results for a 2 $mm^2$ device fabricated with a 100 µm-thick composite film. Both the on and off curves were nearly linear within the tested voltage range, indicating ohmic electrical contacts between the composite film and the two Au electrodes. This result also suggested that the $Cs_2AgBiBr_6$-PVA composite film of this example was hole dominant (p-doped).

From the approximate slopes of the curves, the incident X-ray flux roughly tripled the charge carrier concentration in the composite film. The current on/off ratio remained at around three from the −400 V to 400 V bias. This on/off ratio could be improved by adding an appropriate hole blocking layer at one of the electrode-composite film interfaces to reduce the off current.

Noticeably, the resistivity of the composite film when the X-ray was off was calculated to be about $2 \times 10^{11}$ Ωcm. Such a high resistivity agreed with a significantly reduced ionic mobility in the $Cs_2AgBiBr_6$ crystals compared to the haloplumbate perovskites (see, e.g., Pan, W. C. et al. *Nature Photonics* 2017, 11 (11), 726).

Figure 4:
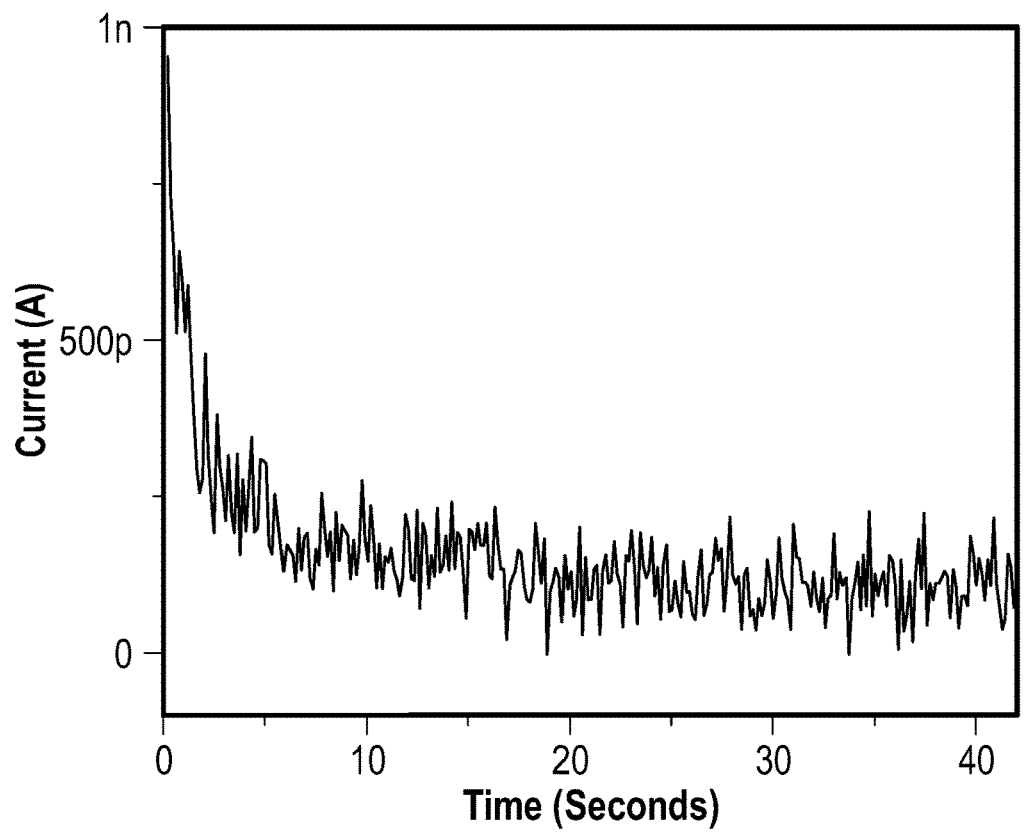
FIG. 4 depicts the current-time response of an embodiment of a polyvinyl alcohol film (100 μm thickness) at 400 V to four X-ray on/off cycles.

Transient responses of the X-ray detectors were also evaluated at a constant 50 V, 100 V, and 400 V as shown at FIG. 3C, FIG. 3D, and FIG. 3E, respectively. In all cases, noticeable current increases were observed when the X-ray irradiation was turned on. As a control experiment, the device with a pure PVA polymer film had a negligible response to X-ray on/off, as shown at FIG. 4. FIG. 4 depicts the current-time response of a pure PVA film (100 µm thickness) at 400 V to four X-ray on/off cycles. No obvious current increase/decrease was observed.

At 400 V (FIG. 3E), the photocurrent reached about 10 nA, leading to a sensitivity of 0.04 µC mGy$_{air}^{-1}$ cm$^{-2}$. A comparable sensitivity has been reported using single crystalline $Cs_2AgBiBr_6$ (see, e.g., Pan, W. C. et al. *Nature Photonics* 2017, 11 (11), 726). However, the use of the composite films in the examples herein provide manufacturing scalability capable of delivering large-area low-cost X-ray detectors.

Devices with different film thicknesses were also investigated, and a plot of photocurrent vs. applied electrical field is shown at FIG. 3F.

Under the same electrical field, increasing the film thickness from 50 µm to 100 µm enhanced the photocurrent by about 100%. This result may have been caused by an improved X-ray photon absorption and/or increased generation of mobile charge carriers in the thicker composite film.

However, the 150 µm-thick film showed about the same photocurrent as the 100 µm film at the same applied electrical field bias. This observation likely indicated that the charge carrier collection may have reached a saturation point in the 150 µm-thick film. It is believed that only charge carriers located within a top and a bottom region of the film could successfully migrate to the electrodes. Therefore, the diffusion length of the charge carriers in the composite film was on the order of about 50 µm to about 100 µm.

The flexibility of one X-ray detector that included a 100 µm composite film was examined by measuring its current responses at a constant 100 V, with different bending radii. The device was conformally laminated onto the outer surface of a glass tube having a desired radius.

Specifically, the devices included 100 nm evaporated Au thin films as the top and bottom electrodes, and the film was conformally wrapped around a 4 mm-diameter glass tube or a 20 mm-diameter glass tube.

Figure 5:
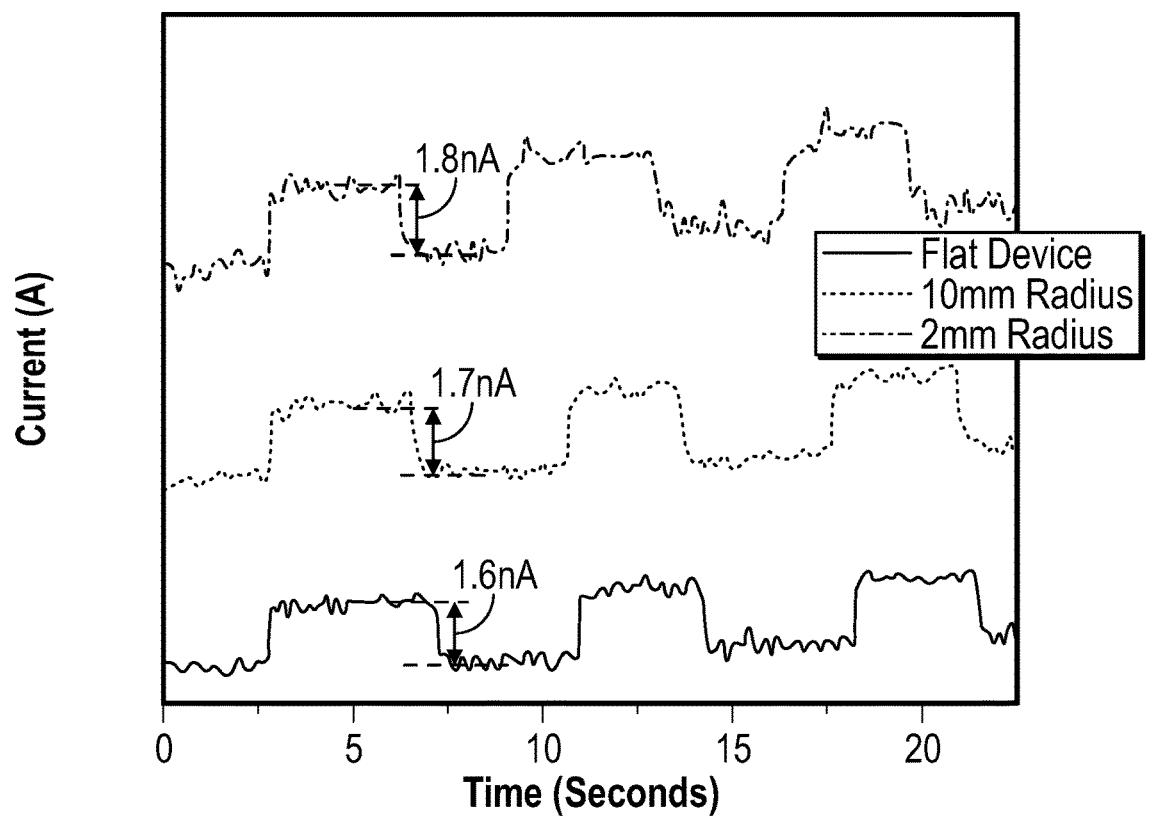
FIG. 5 depicts the X-ray induced photocurrent responses of an embodiment of a device in both flat and curved (10 mm and 2 mm bending radii) states.

FIG. 5 depicts the X-ray induced photocurrent responses of one detector in both flat and curved (10 mm and 2 mm bending radiuses) states. The X-ray induced photocurrent increased from 1.6 nA in a flat device to 1.7 nA and 1.8 nA when the device was in a bent configuration having bending radii of 10 mm and 2 mm, respectively.

The slight increase of the photocurrent may have been due to an increase of exposure area in the bent device. These results appeared to imply that severe bending did not damage the composite film, thereby demonstrating its mechanical robustness, which can benefit flexible X-ray detector applications.

Also fabricated was a pixelated X-ray imager with an array of 6×6 detector pixels on the same composite film. Silver paste was screen printed using a contact mask on one side of the thin film, and a 100 nm-thick Au layer was evaporated on the other side. The letter "F" was cut into a 25 µm-thick molybdenum foil and laminated onto the Au side of the X-ray imager. The imager was placed on a motorized stage, and the photocurrent of each detector pixel was recorded at a constant 100 V bias and the center of individual detector illuminated by the X-ray flux. A plot of the photocurrents for all the pixels indicated a clear resolution of the pattern geometry of the molybdenum foil.

An image was collected of the X-ray imager having 6×6 detectors fabricated on a 100 µm-thick $Cs_2AgBiBr_6$/PVA composite film. Silver paste islands were screen printed on the front side and a 100 nm-thick Au layer was evaporated on the back side of the film for electrical contacts. One 25 µm-thick molybdenum foil with an "F"-letter pattern was laminated on the Au film. The photocurrent contrast among all the pixels resolved the "F" pattern of the molybdenum foil.

Example 4—Other Methods of Forming Composite Materials

In addition to the processes of the previous examples, composite materials can be made by hot pressing, extrusion, molding, or 3D printing.

Optical images of 3D printed $Cs_2AgBiBr_6$/PVDF composite materials were collected. The 3D printed composite materials of this example were in the shape of the letters "FSU" or "OO".

Also produced were a solution-casted perovskite/composite film, an extruded composite filament, a molded composite sheet, and a 3D printed composite bulk sample that included $CsPbBr_3$/PVDF. SEM top and cross-sectional views of the composites also were collected.

Figure 6A:
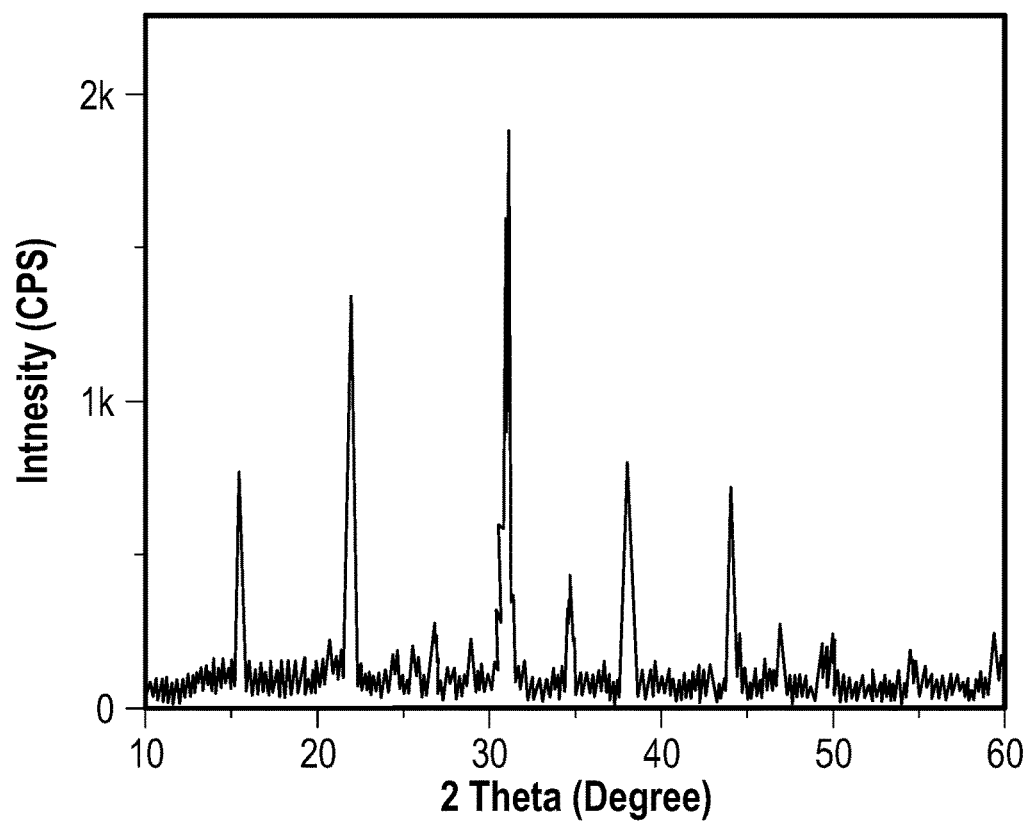
FIG. 6A depicts X-ray diffraction and photoluminescence data for an embodiment of a composite material.
Figure 6B:
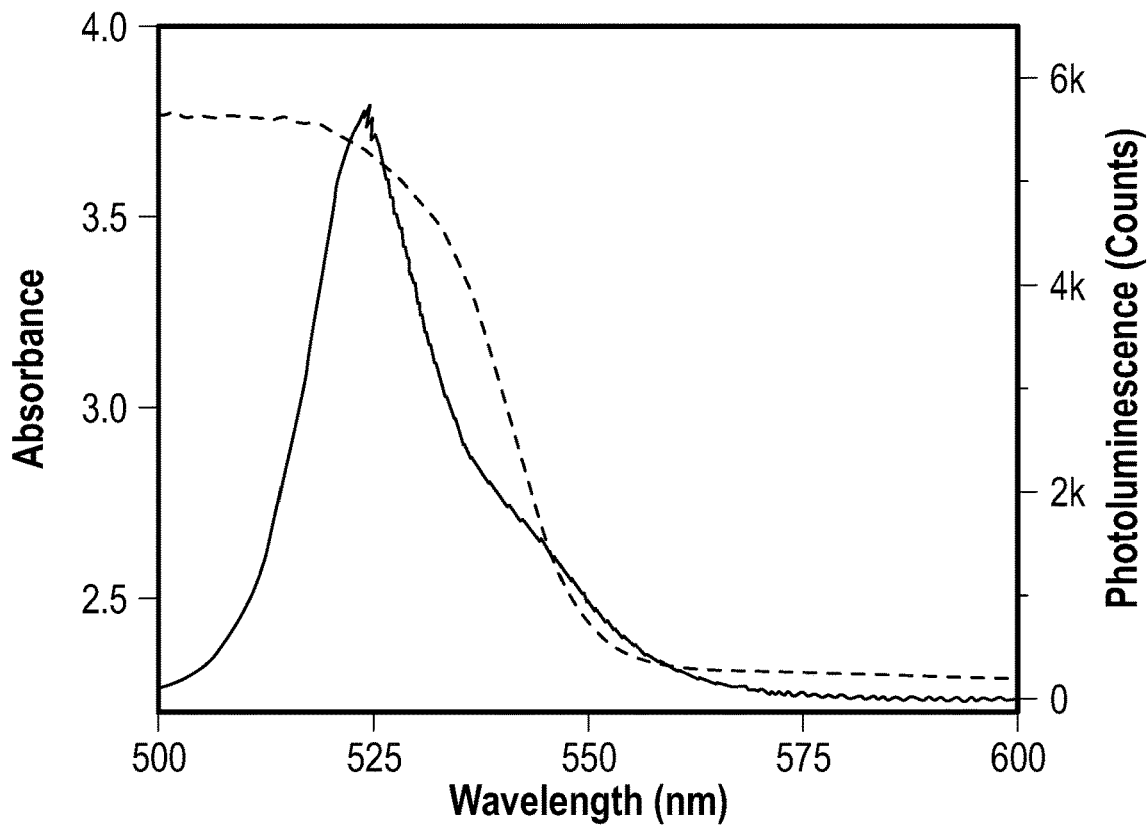
FIG. 6B depicts UV-Vis data for an embodiment of a composite material.

XRD, PL, and UV-Vis data were collected for the $CsPbBr_3$/PVDF composite material, as depicted at FIG. 6A and FIG. 6B.

The $CsPbBr_3$/PVDF composite material film was used to fabricate a device. Schematics of the device are depicted at FIG. 7A (top view showing two contacts) and FIG. 7B (cross-sectional view showing two contacts). FIG. 7C is a top view of the device.

Figure 8A:
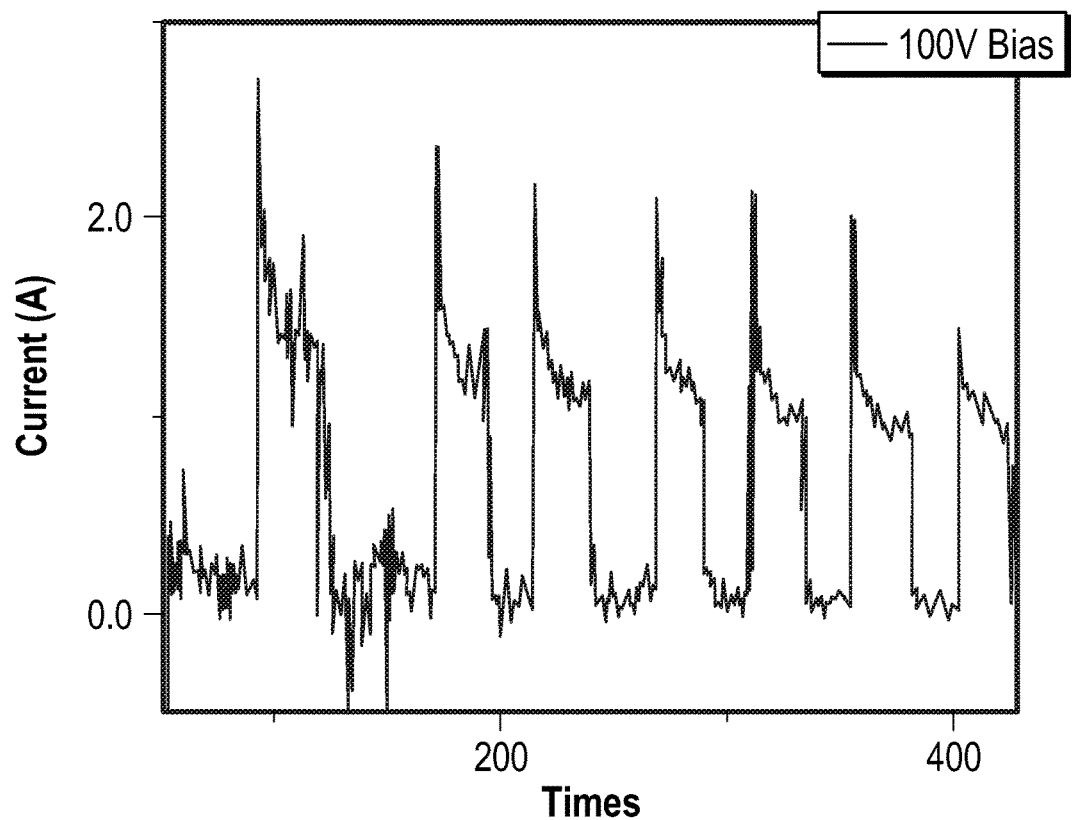
FIG. 8A, FIG. 8B, and FIG. 8C depict the response of an embodiment of a device to high energy photons at 100 V (FIG. 8A), 500 V (FIG. 8B), and 800 V (FIG. 8C).
Figure 8B:
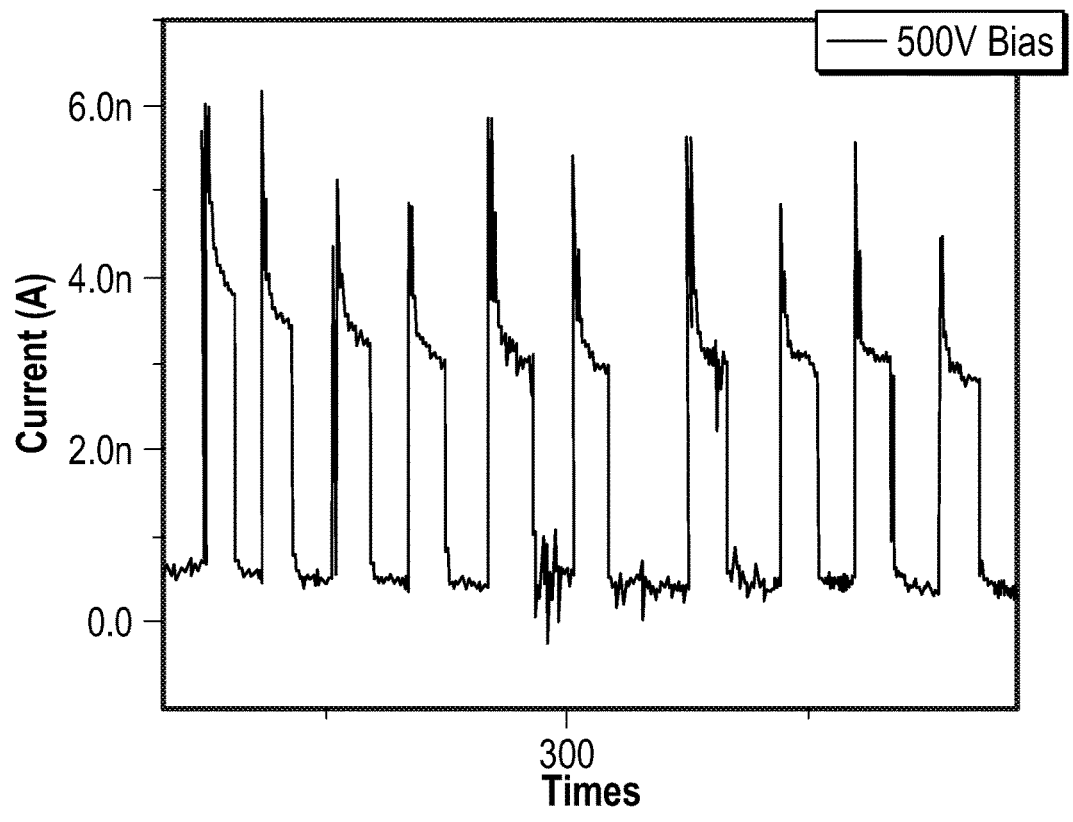
Figure 8C:
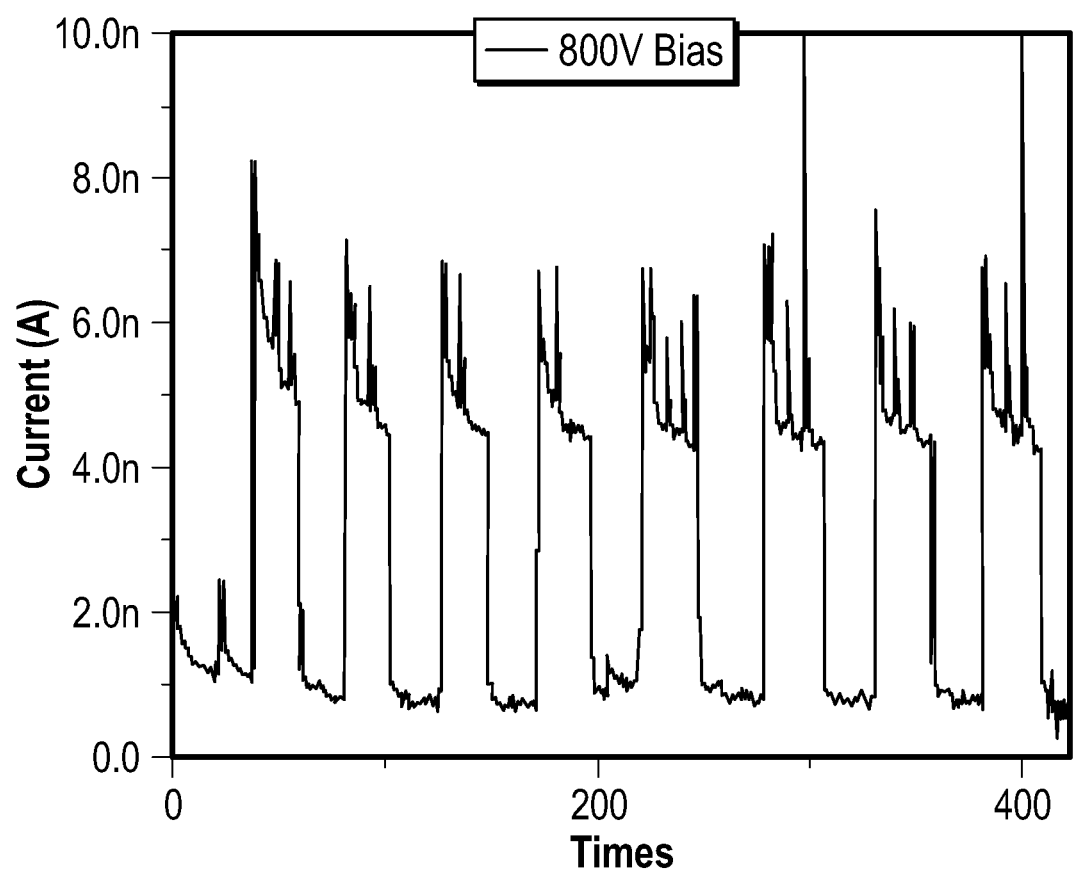

The device's responses to high energy photons is depicted at FIG. 8A (100 V), FIG. 8B (500 V), and FIG. 8C (800 V).

Figure 9:
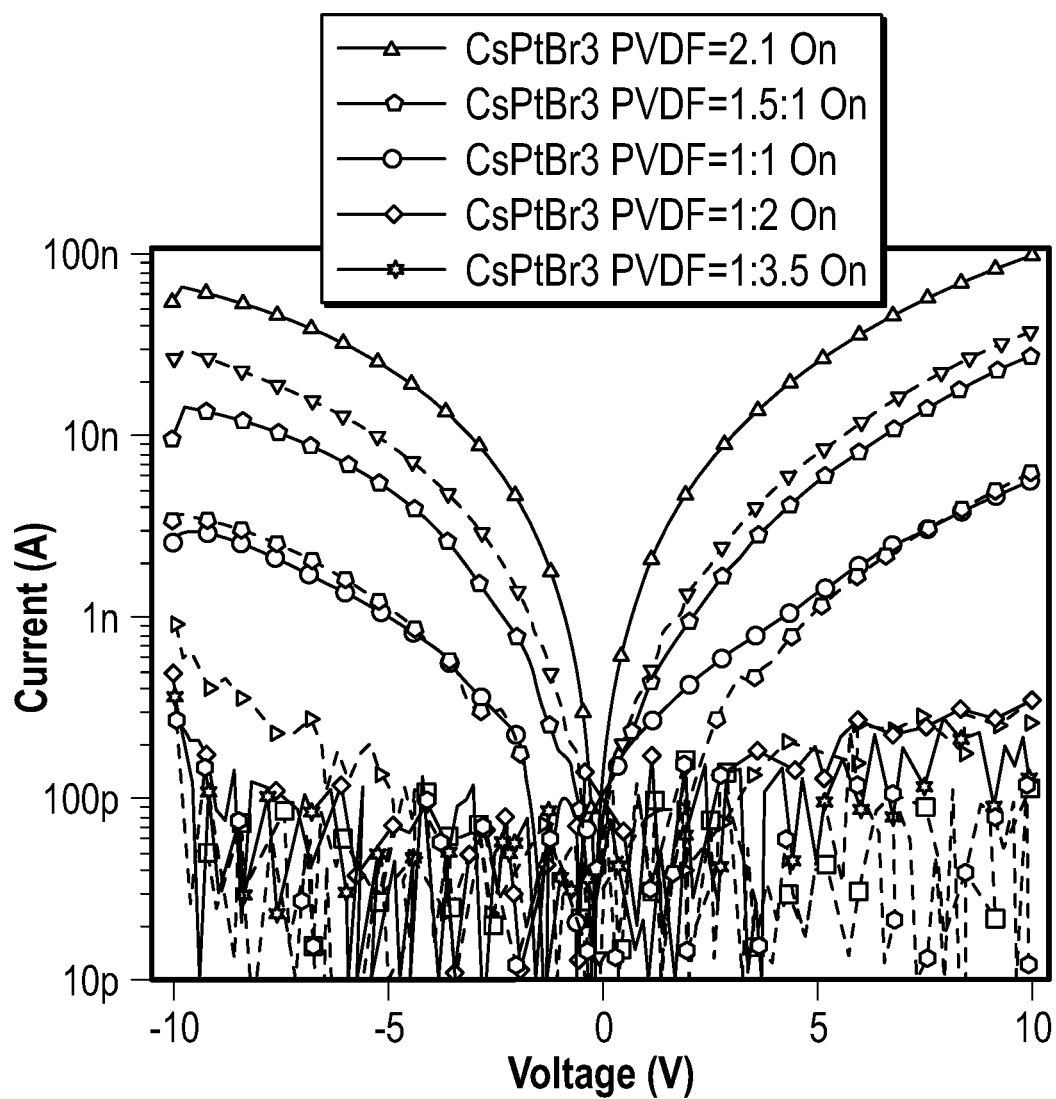
FIG. 9 depicts the X-ray response to high energy photons of various embodiments of composite material films.
Figure 10A:
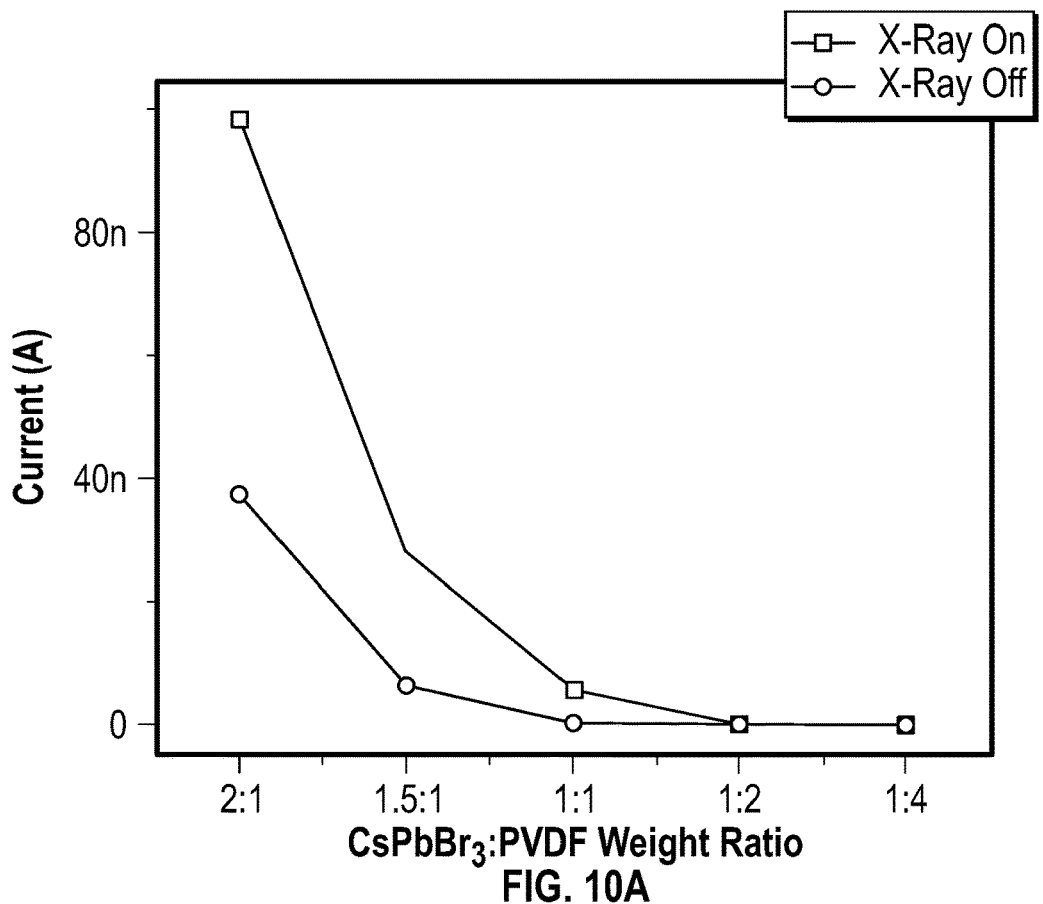
FIG. 10A depicts a plot of current versus the weight ratio of metal halide perovskite to polymer matrix in X-ray on and X-ray off states.
Figure 10B:
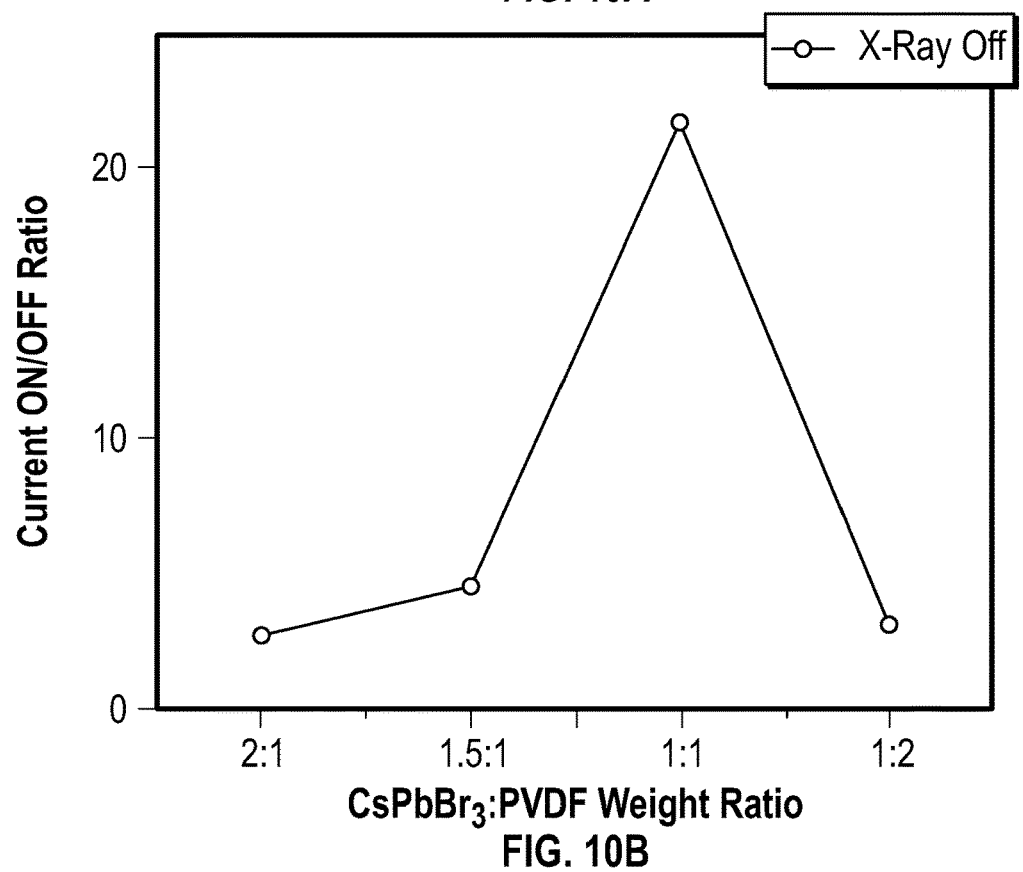
FIG. 10B depicts a plot of the Current On/Off Ratio versus the weight ratio of metal halide perovskite to polymer matrix for an embodiment of a composite material.

The X-ray response to high energy photons of various $CsPbBr_3$/PVDF composite films having different weight ratios also was analyzed, as shown at FIG. 9. The devices had a surface planar configuration. FIG. 10A depicts a plot of current versus the weight ratio of $CsPbBr_3$:PVDF in X-ray on and X-ray off states, and FIG. 10B depicts a plot of the Current On/Off Ratio versus the weight ratio of $CsPbBr_3$:PVDF.

The responses to high energy photons of the 3D printed $CsPbBr_3$/PVDF composites were also tested.

Hot pressed $CsPbBr_3$/PVDF composites and their responses to high energy photons also were determined.

Hot pressed $CsPbBr_3$/PVDF composite rods and their responses to gamma-ray pulses were also fabricated and determined, respectively.

Example 5—3D Printed Radiation Sensors 3D printed radiation sensors were made with a composite material film that included $CsPbBr_3$ and poly(lactic acid) (PLA).

In addition to the 3D printed composite material films that were used to produce the devices of this example, extruded and hot pressed samples of the $CsPbBr_3$:PLA material also were prepared.

Figure 11A:
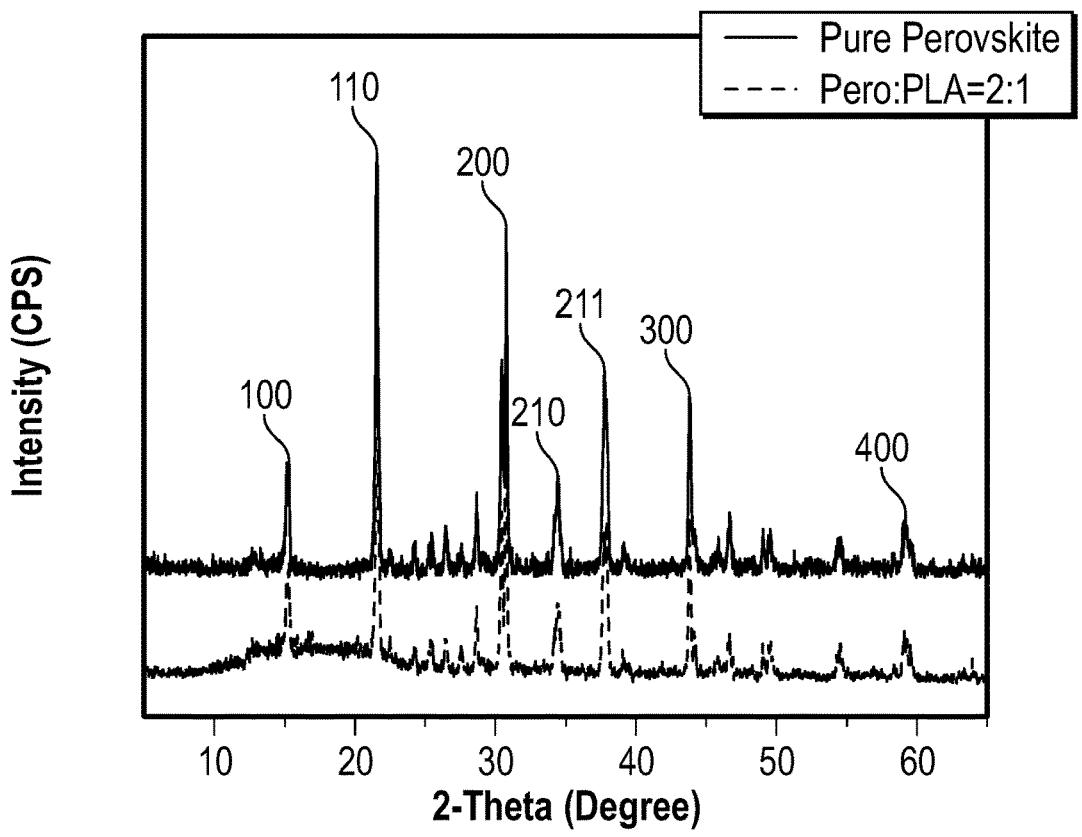
FIG. 11A depicts X-ray diffraction spectra of an embodiment of a metal halide perovskite, and an embodiment of a composite material film having a 2:1 weight ratio of metal halide perovskite to polymer matrix.

FIG. 11A depicts XRD spectra of the pure perovskite having a unit cell of formula $CsPbBr_3$, and a composite material film having a 2:1 weight ratio of the perovskite having a unit cell of $CsPbBr_3$ to PLA.

Figure 11B:
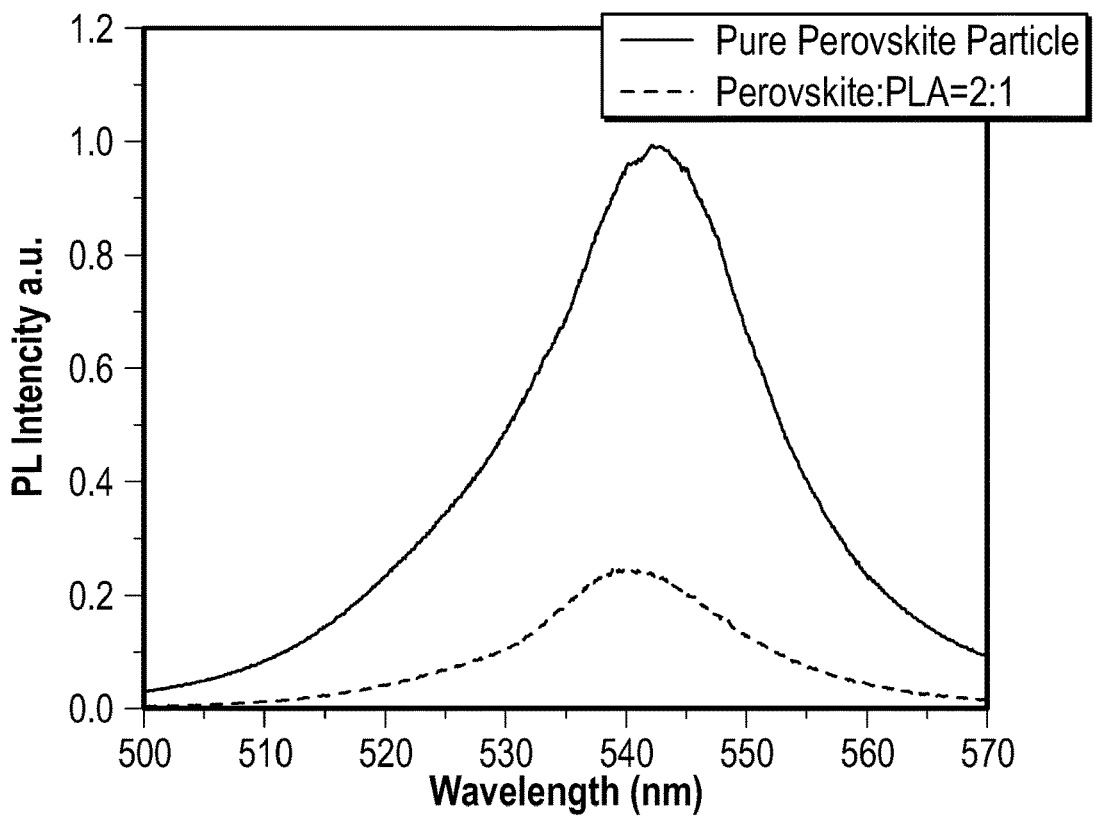
FIG. 11B depicts a plot of the photoluminescence of an embodiment of a metal halide perovskite, and an embodiment of a composite material film having a 2:1 weight ratio of metal halide perovskite to polymer matrix.

FIG. 11B depicts a plot of the photoluminescence of the pure perovskite having a unit cell of formula $CsPbBr_3$, and a composite material film having a 2:1 weight ratio of the perovskite having a unit cell of $CsPbBr_3$ to PLA.

Figure 11C:
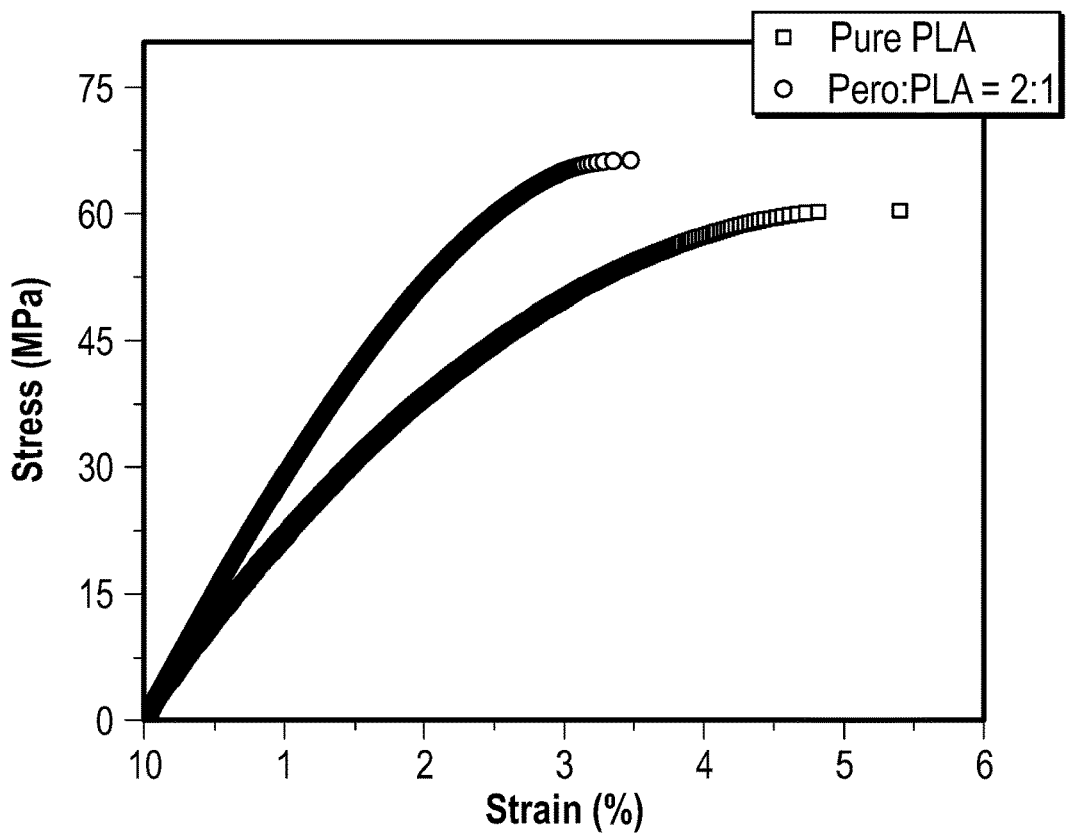
FIG. 11C depicts a plot of the stress-strain curves of an embodiment of a metal halide perovskite, and an embodiment of a composite material film having a 2:1 weight ratio of metal halide perovskite to polymer matrix.

FIG. 11C depicts a plot of the stress-strain curves of the pure perovskite having a unit cell of formula $CsPbBr_3$, and a composite material film having a 2:1 weight ratio of the perovskite having a unit cell of $CsPbBr_3$ to PLA.

Figure 11D:
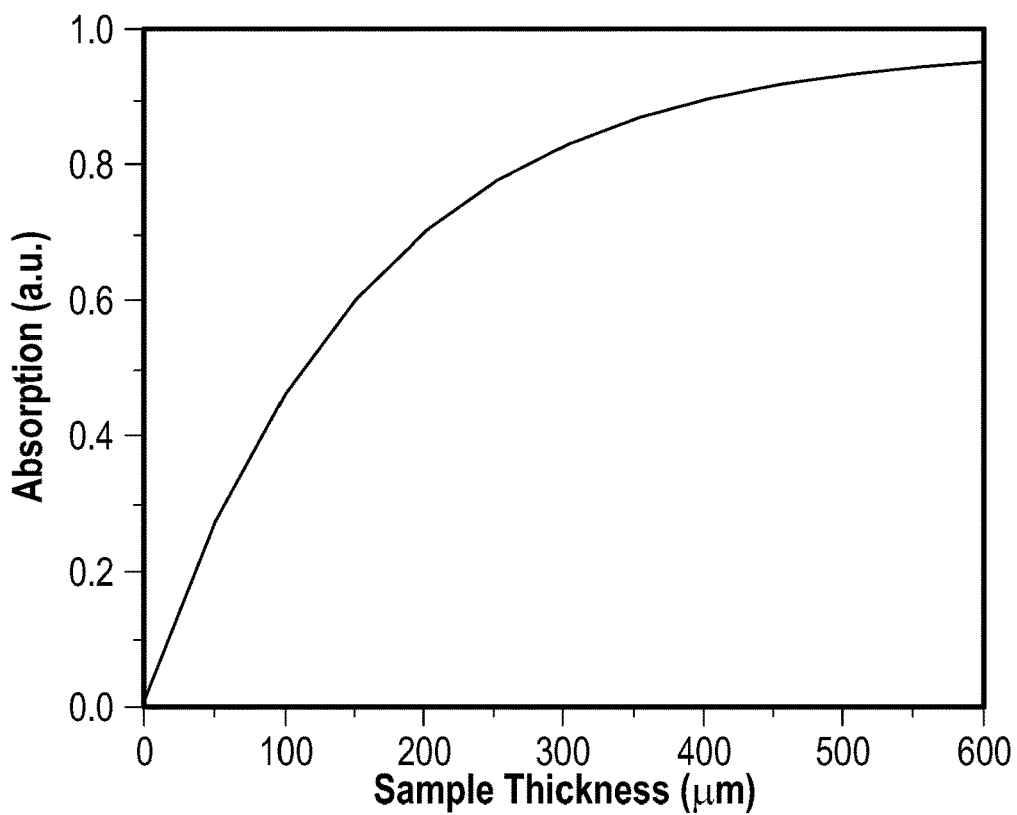
FIG. 11D depicts a plot of the absorbance of an embodiment of a metal halide perovskite, and an embodiment of a composite material film having a 2:1 weight ratio of metal halide perovskite to polymer matrix.

FIG. 11D depicts a plot of the absorbance of the pure perovskite having a unit cell of formula $CsPbBr_3$, and a composite material film having a 2:1 weight ratio of the perovskite having a unit cell of $CsPbBr_3$ to PLA.

Figure 12:
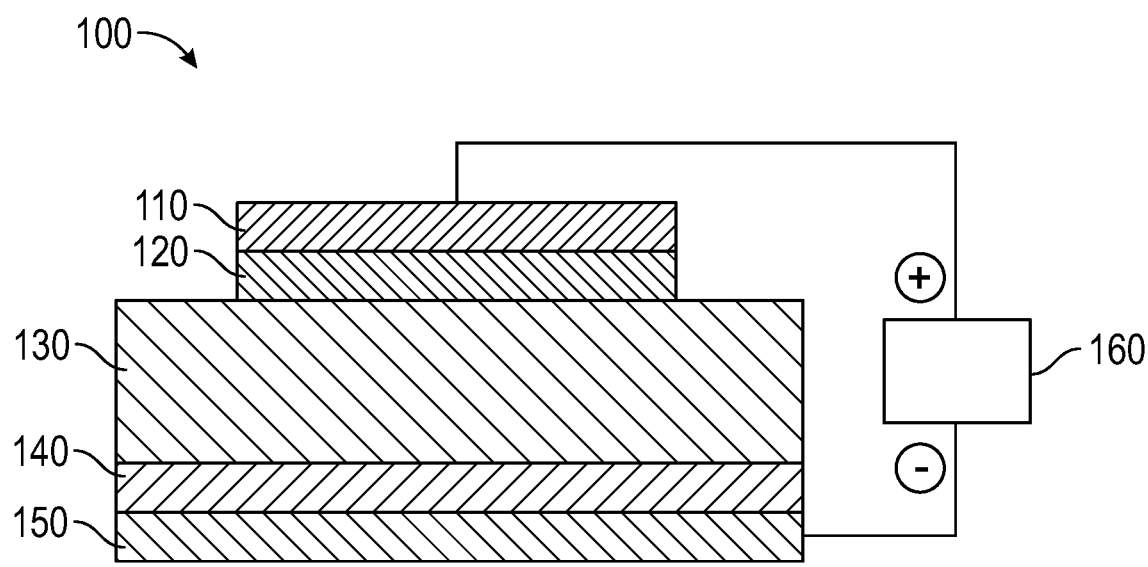
FIG. 12 is a schematic of an embodiment of a device.

A schematic of a device of this example is depicted at FIG. 12. As depicted at FIG. 12, the device 100 included a gold electrode 110 and a silver electrode 150. Arranged between the gold electrode 110 and the silver electrode 150 was a layer of $MoO_x$ 120, a layer of the $CsPbBr_3$:PLA composite material 130, and a layer of $C_{60}$ 140. The layer of $MoO_x$ 120 was arranged between and in contact with both the gold electrode 110 and the layer of the $CsPbBr_3$:PLA composite material 130. The layer of the $CsPbBr_3$:PLA composite material 130 was arranged between and in contact with both the layer of $MoO_x$ 120 and the layer of $C_{60}$ 140. The layer of $C_{60}$ 140 was arranged between and in contact with both the layer of the $CsPbBr_3$:PLA composite material 130 and the silver electrode 150. A source-measure device (KEITHLEY® 2410 HI VOLTAGE SOURCEMETER source-measure device) was in contact with the gold electrode 110 and the silver electrode 150. In the formula "$MoO_x$", x may be an integer or fraction from 0 to 6.

A series of five devices having the configuration of FIG. 12 were produced using a commercially available 3D printer. The devices were identical, except for the thicknesses of the layers of the $CsPbBr_3$:PLA (2:1) composite material. The thicknesses of the layers of the $CsPbBr_3$:PLA (2:1) composite material were 50 µm, 100 µm, 200 µm, 400 µm, and 500 µm.

Figure 13A:
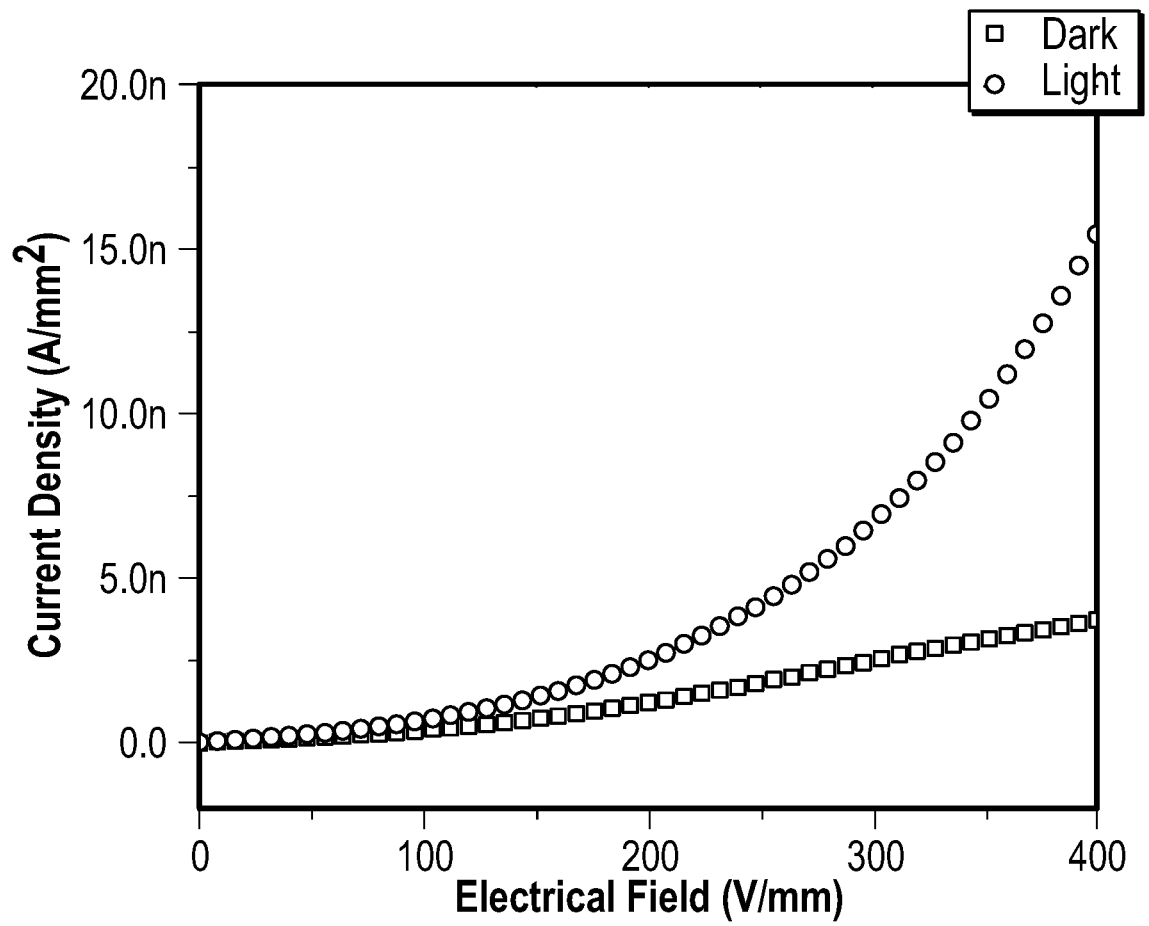
FIG. 13A, FIG. 13B, and FIG. 13C depict plots of the current density versus electrical field for embodiments of devices having embodiments of composite material layers of different thicknesses: 50 μm (FIG. 13A), 100 μm (FIG. 13B), and 200 μm (FIG. 13C).
Figure 13B:
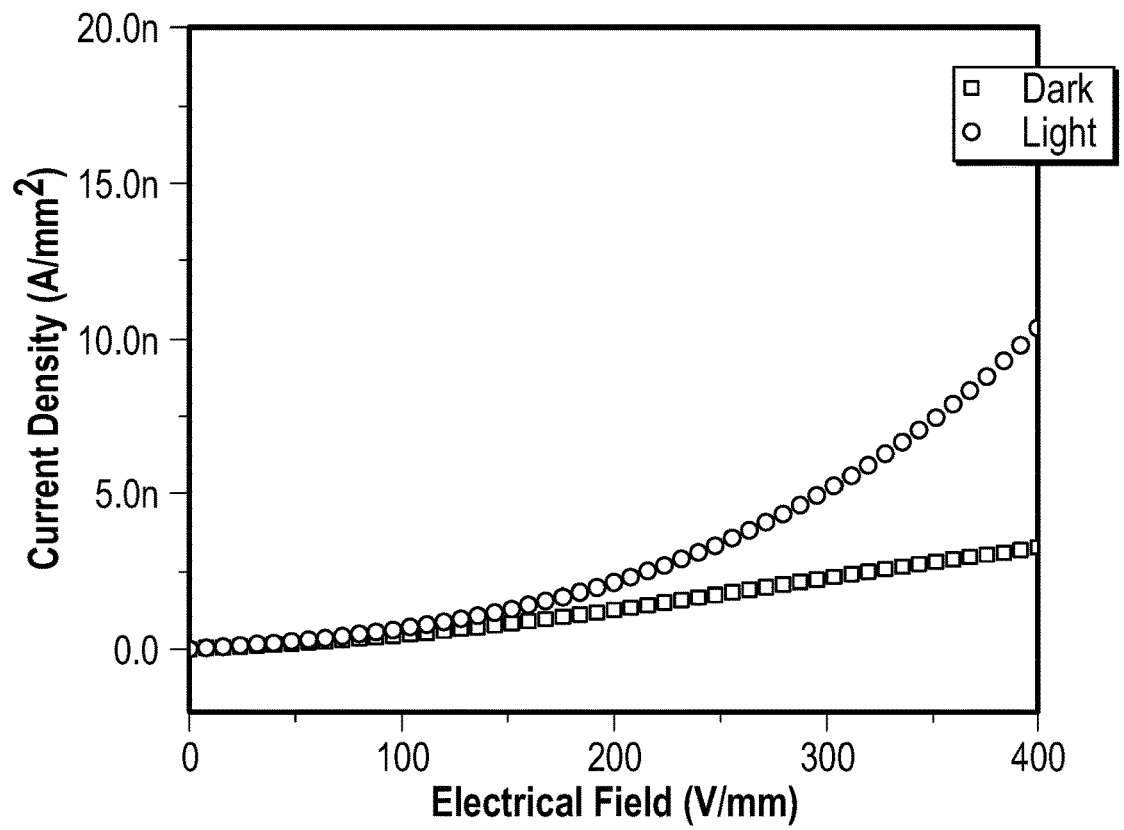
Figure 13C:
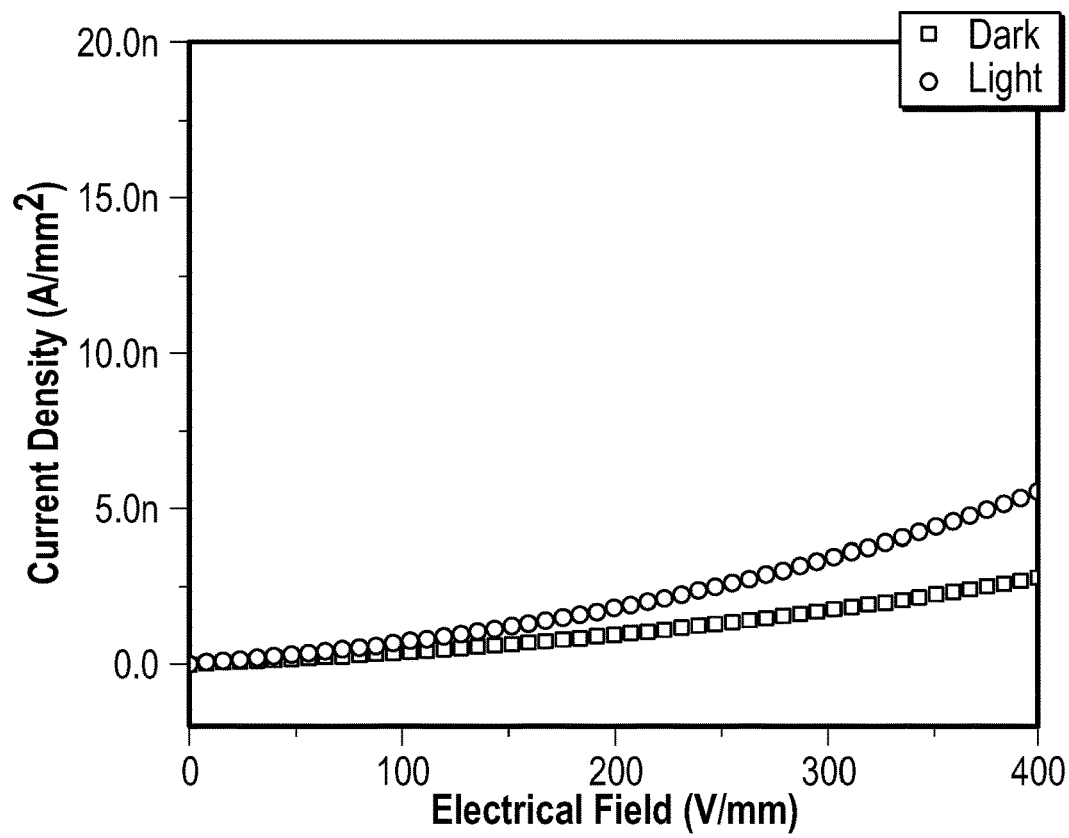
Figure 14:
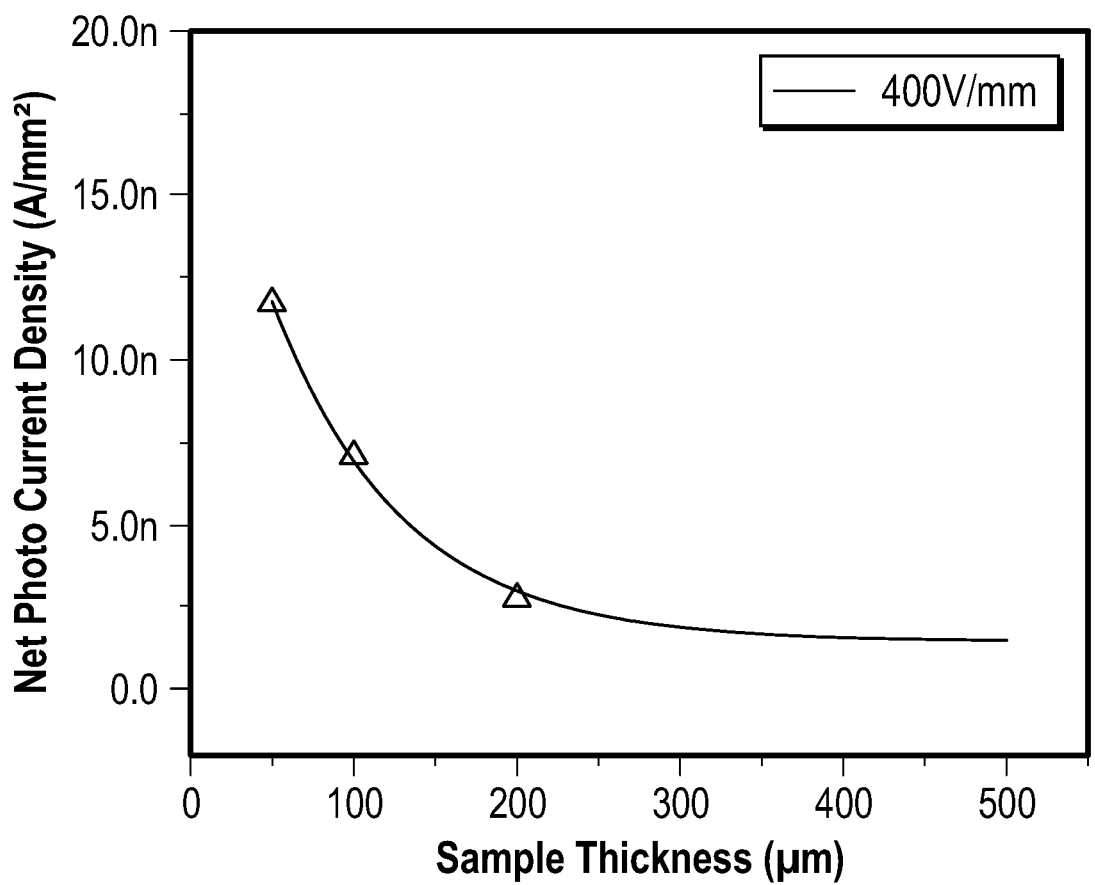
FIG. 14 depicts a plot of net photocurrent density versus thickness of embodiments of composite material layers.

The visible light responses of the devices were tested. Blue light was directed at the devices that included composite material layers ($CsPbBr_3$:PLA (2:1)) having thicknesses of 50 µm, 100 µm, and 200 µm. Plots of the current density versus electrical field are provided for each of these devices at FIG. 13A (50 µm), FIG. 13B (100 µm), and FIG. 13C (200 µm). FIG. 14 depicts a plot of net photocurrent density versus thickness of the composite material layers of the devices.

Figure 15:
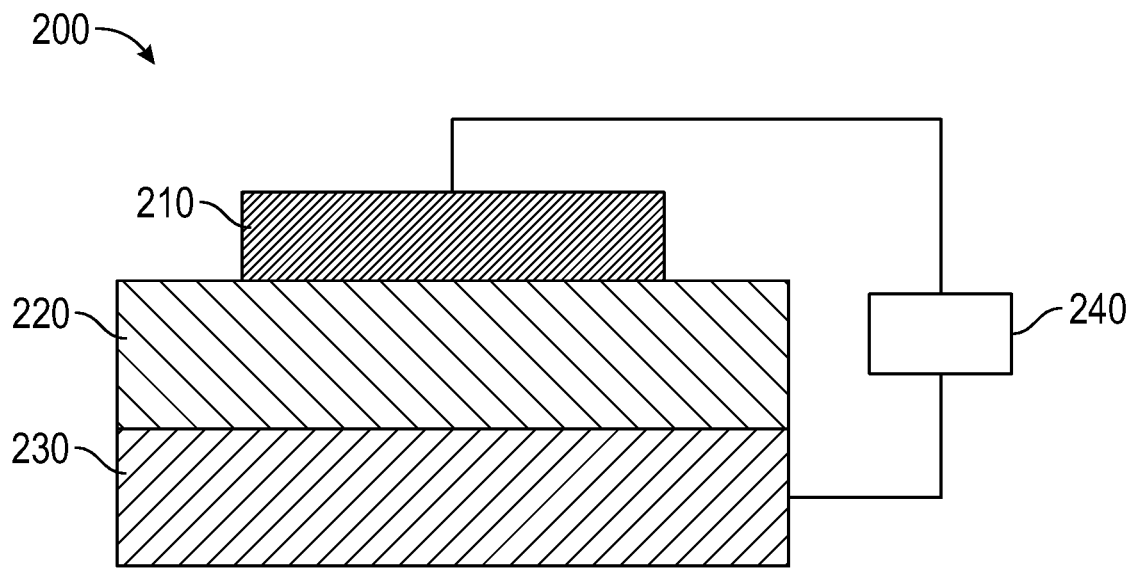
FIG. 15 is a schematic of an embodiment of a device.

A schematic of another device of this example is depicted at FIG. 15. As depicted at FIG. 15, the device 200 included a first carbon electrode 210 and a second carbon electrode 230, and a layer of the CsPbBr3:PLA (2:1) composite material 130 arranged between and in contact with the first carbon electrode 210 and the second carbon electrode 230. Each layer of the devices having the configuration depicted at FIG. 15 was formed via 3D printing. A source-measure device (KEITHLEY® 2410 HI VOLTAGE SOURCEMETER source-measure device) was in contact with the first carbon electrode 210 and the second carbon electrode 230.

A series of six devices having the configuration of FIG. 15 were produced using a commercially available 3D printer. The devices were identical, except for the thicknesses of the layers of the $CsPbBr_3$:PLA (2:1) composite material. The thicknesses of the layers of the $CsPbBr_3$:PLA (2:1) composite material were 50 µm, 100 µm, 200 µm, 300 µm, 400 µm, and 500 µm.

Figure 16A:
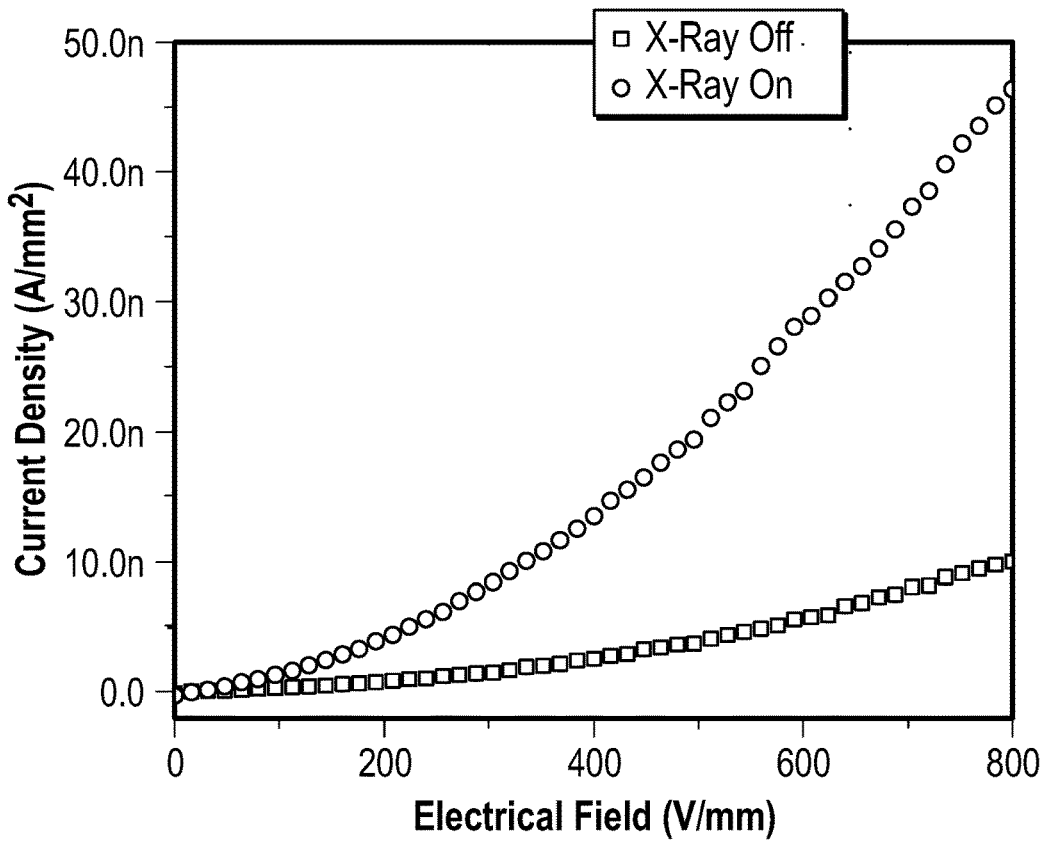
FIG. 16A, FIG. 16B, and FIG. 16C depict plots of the current density versus electrical field for embodiments of devices having composite material layers of different thicknesses: 50 μm (FIG. 16A), 100 μm (FIG. 16B), and 300 μm (FIG. 16C).
Figure 16B:
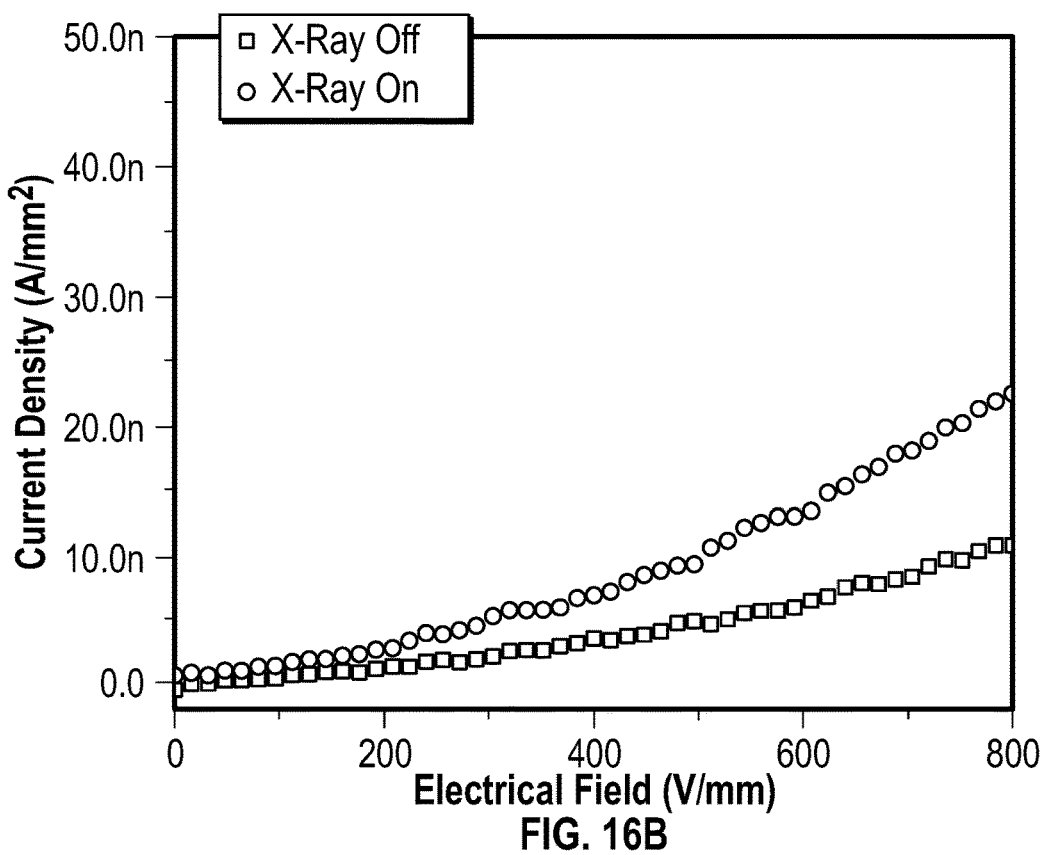
Figure 16C:
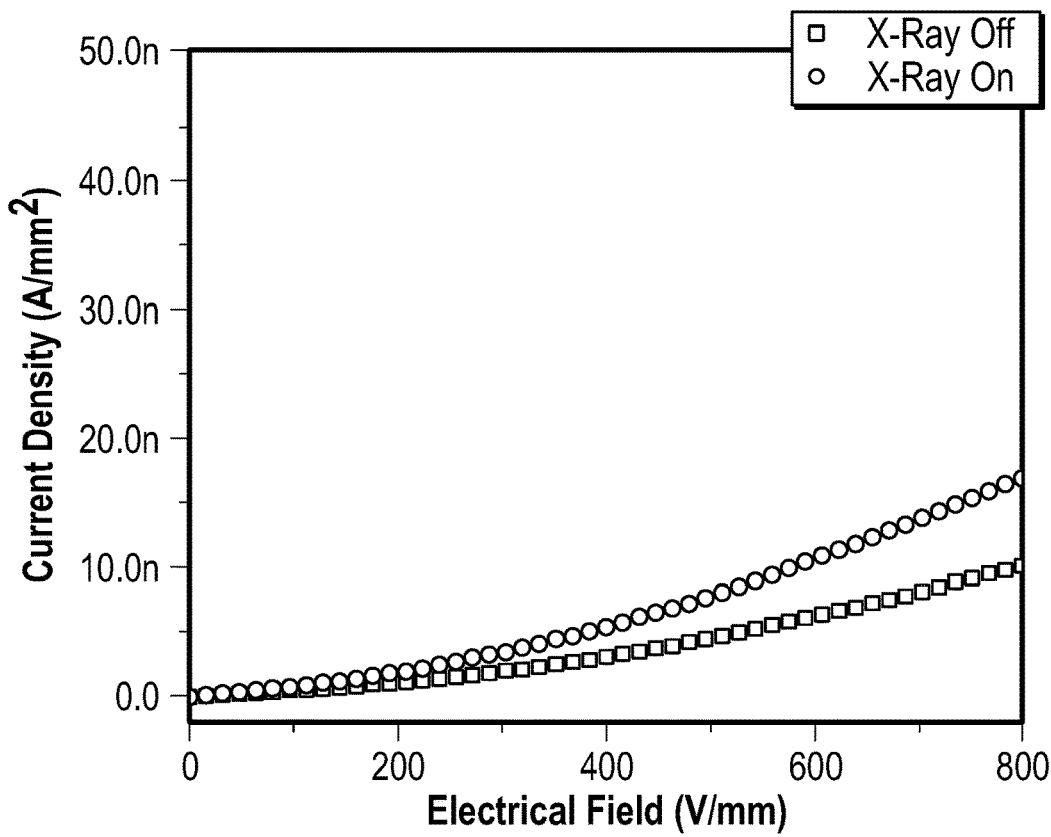
Figure 17:
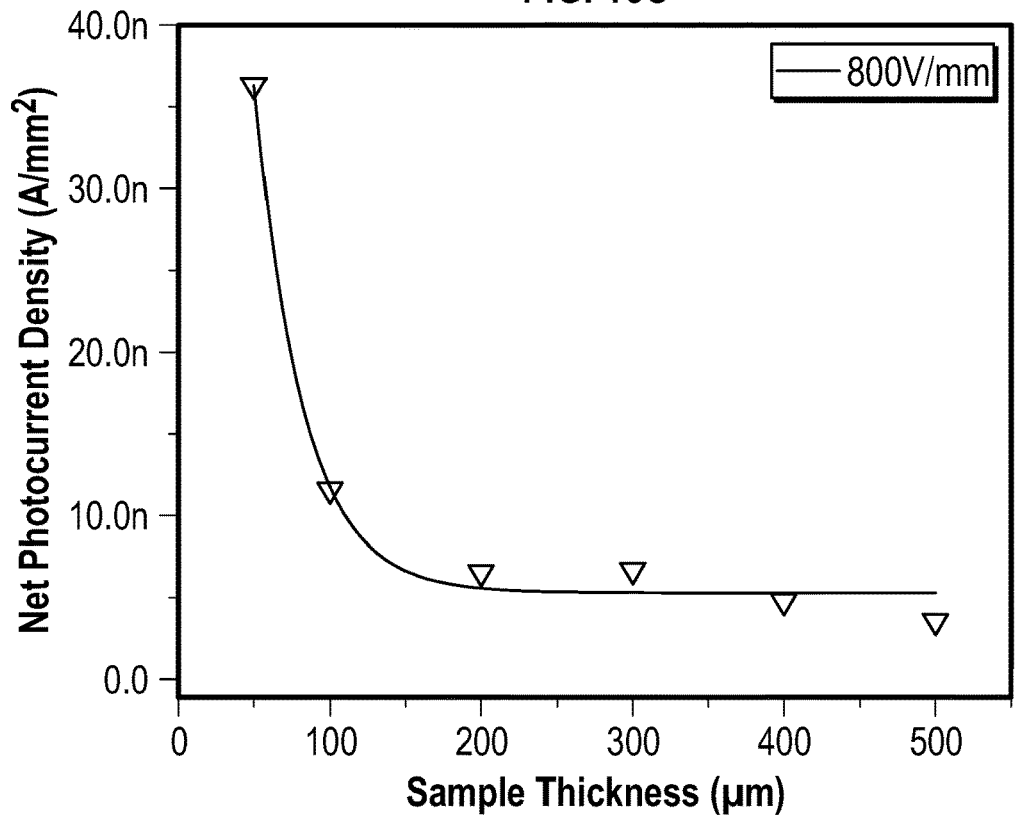
FIG. 17 depicts a plot of net photocurrent density versus thickness of composite material layers of embodiments of devices.

The X-ray responses of the devices were tested. X-ray radiation was directed at the series of devices that included composite material layers ($CsPbBr_3$:PLA (2:1)) having thicknesses of 50 µm, 100 µm, and 300 µm. Plots of the current density versus electrical field for the devices is depicted at FIG. 16A (50 µm), FIG. 16B, (100 µm), and FIG. 16C (300 µm). FIG. 17 depicts a plot of net photocurrent density versus thickness of the composite material layers of the devices.

Figure 18:
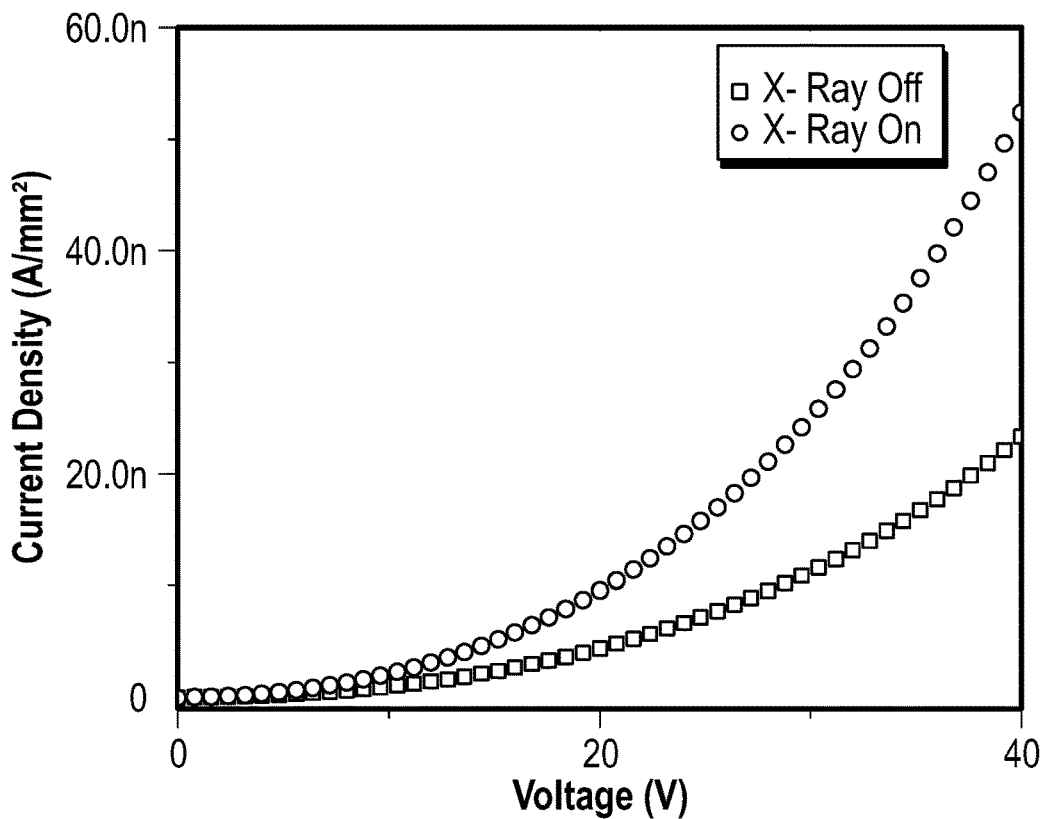
FIG. 18 depicts a plot of the X-ray response of an embodiment of a device.
Figure 19:
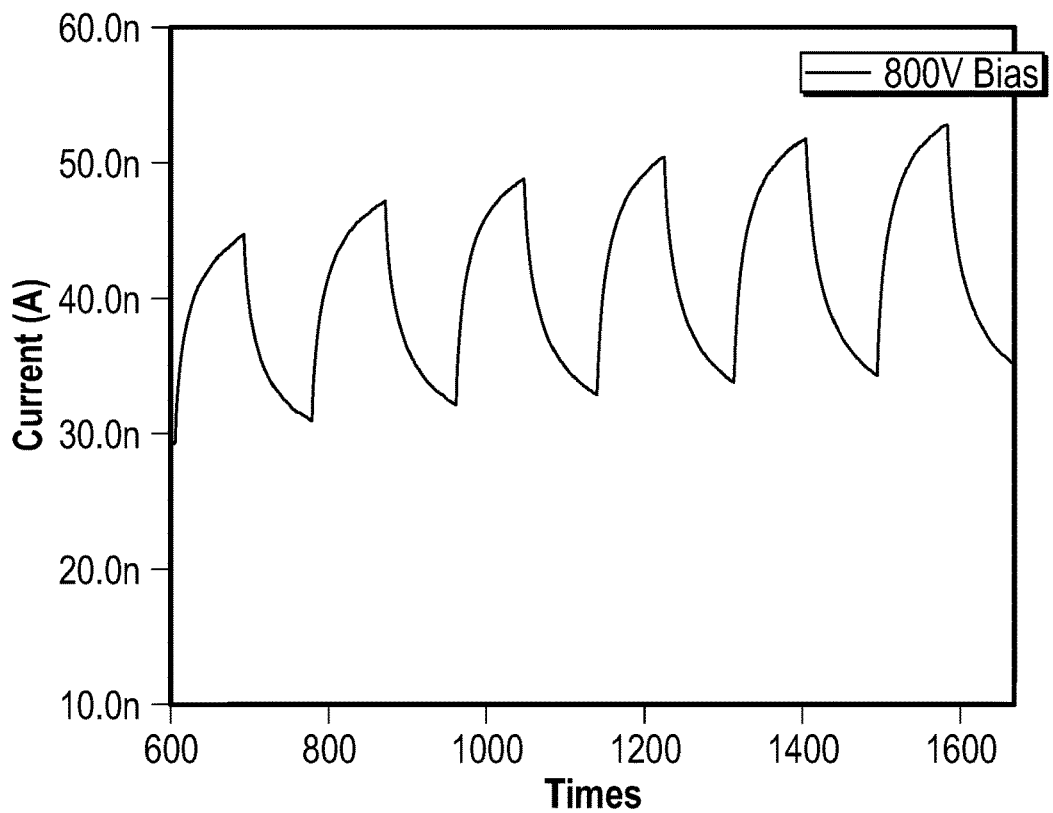
FIG. 19 depicts a plot of current versus time (800 V bias) for an embodiment of a device.

Also prepared was a device that included more than one composite material layer ($CsPbBr_3$:PLA (2:1)). The device of this example included five 3D printed layers, and had the following structure: carbon electrode layer/composite material layer ($CsPbBr_3$:PLA (2:1))/carbon electrode layer/composite material layer ($CsPbBr_3$:PLA (2:1))/carbon electrode layer. The X-ray response of this device was tested, and is depicted at FIG. 18. FIG. 19 depicts a plot of current versus time (800 V bias) for the device.

We claim:

1. A composite material comprising:
   a polymer matrix comprising a polymer, wherein the polymer comprises poly(2-hydroxyethyl methacrylate) or polyvinyl alcohol (PVA); and
   a metal halide perovskite dispersed in the polymer matrix;
   wherein the metal halide perovskite is a lead-free metal halide double perovskite of the following formula—

$$Cs_2BB'X_6 \qquad \text{(formula (I))},$$

wherein B is Sb or Bi,
   B' is Cu, Ag, or Au, and
   X is Cl, Br, or I; and
   wherein (i) B is Bi, B' is Ag, X is Br, and the lead-free metal halide double perovskite has the formula $Cs_2BiAgBr_6$, (ii) B is Bi, B' is Au, X is Br, and the lead-free metal halide double perovskite has the formula $Cs_2BiAuBr_6$, (iii) B is Sb, B' is Ag, X is Br, and the lead-free metal halide double perovskite has the formula $Cs_2SbAgBr_6$, or (iv) B is Sb, B' is Au, X is Br, and the lead-free metal halide double perovskite has the formula $Cs_2SbAuBr_6$.

2. The composite material of claim 1, wherein the polymer comprises the polyvinyl alcohol (PVA).

3. The composite material of claim 1, wherein the polymer has a weight average molecular weight ($M_w$) of about 50 K to about 750 K.

4. The composite material of claim 1, wherein the weight ratio of the metal halide perovskite to the polymer matrix is about 1:1 to about 3:1.

5. The composite material of claim 1, wherein the composite material is a film.

6. A device comprising:
   a first electrode;
   a second electrode; and
   the film of claim 5, wherein the film is arranged between the first electrode and the second electrode.

7. A device comprising:
   a first electrode;
   a second electrode; and
   the film of claim 5, wherein the film has a first side and a second side, and the first electrode and the second electrode are arranged on the first side of the film.

8. A method of forming a device, the method comprising:
   printing with a 3D printer the film of claim 5 on a substrate;
   wherein the film has a first side and a second side, and the first side of the film is in contact with the substrate after the printing of the film.

* * * * *